US012567842B2

(12) United States Patent
Joly

(10) Patent No.: US 12,567,842 B2
(45) Date of Patent: Mar. 3, 2026

(54) RADIO FREQUENCY POWER AMPLIFIER IMPLEMENTING A GAIN EQUALIZER AND A PROCESS OF IMPLEMENTING THE SAME

(71) Applicant: MACOM Technology Solutions Holdings, Inc., Lowell, MA (US)

(72) Inventor: Christophe Joly, Sacramento, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 870 days.

(21) Appl. No.: 17/847,761

(22) Filed: Jun. 23, 2022

(65) Prior Publication Data

US 2023/0421114 A1    Dec. 28, 2023

(51) Int. Cl.
H03F 1/56      (2006.01)
H03F 3/24      (2006.01)
H03G 3/30      (2006.01)

(52) U.S. Cl.
CPC ............. H03F 1/565 (2013.01); H03F 3/245 (2013.01); H03G 3/30 (2013.01); H03F 2200/222 (2013.01); H03F 2200/451 (2013.01); H03G 2201/103 (2013.01); H03G 2201/307 (2013.01)

(58) Field of Classification Search
CPC .... H03F 1/565; H03F 3/245; H03F 2200/222; H03F 2200/451; H03F 3/195; H03F 1/0288; H03F 2200/387; H03G 3/30; H03G 2201/103; H03G 2201/307; H03G 5/165
USPC ......................................................... 330/278
See application file for complete search history.

(56) References Cited

U.S. PATENT DOCUMENTS

| | | | | |
|---|---|---|---|---|
| 10,819,303 | B1* | 10/2020 | Park .......................... | H03G 5/28 |
| 2015/0180518 | A1* | 6/2015 | Whittaker ................. | H03F 1/56 |
| | | | | 330/296 |
| 2018/0062580 | A1* | 3/2018 | Rogers ...................... | H03F 1/22 |
| 2018/0248569 | A1* | 8/2018 | Takenaka ............. | H04B 1/0057 |
| 2021/0126595 | A1* | 4/2021 | Miehle ..................... | H03G 5/28 |

* cited by examiner

*Primary Examiner* — Andrea Lindgren Baltzell
*Assistant Examiner* — Jose E Pinero
(74) *Attorney, Agent, or Firm* — BakerHostetler

(57) ABSTRACT

An amplifier includes an input impedance matching network; at least one transistor; and a gain equalizer configured to equalize gain. The gain equalizer is connected to components of the input impedance matching network.

32 Claims, 25 Drawing Sheets

RADIO FREQUENCY POWER AMPLIFIER IMPLEMENTING A GAIN EQUALIZER AND A PROCESS OF IMPLEMENTING THE SAME

FIELD OF THE DISCLOSURE

The disclosure relates to a radio frequency power amplifier implementing a gain equalizer. Additionally, the disclosure relates to a process of implementing a radio frequency power amplifier with a gain equalizer.

BACKGROUND OF THE DISCLOSURE

Radio Frequency (RF) power circuits are used in a variety of applications such as base stations for wireless communication systems and/or the like. The RF power circuits can typically include a transistor die to amplify the RF signal. These devices typically have relatively low characteristic impedances (for example, 2 ohm or less). Input and output impedance matching circuits are typically used to match the RF power circuits to external transmission lines that provide RF signals to and from a RF power transistor. These external transmission lines have characteristic impedances that are typically about 50 ohm. However, the characteristic impedances could be any value as determined by a designer, needed for a particular application and/or system, and/or the like. The input and output matching circuits typically include inductive and capacitive elements that are used to provide impedance matching between the input and output of the RF power transistor.

Recently, there has been a need to implement the RF power circuits to provide RF signals for a significantly larger bandwidth. However, implementing such RF power circuits with a larger bandwidth negatively impacts performance as a gain drops significantly in the RF band due, primarily, to device parasitics as well as other device performance characteristics. For example, current RF power circuits used in 5G infrastructure have an RF bandwidth significantly larger than in the past, which as described above results in a non-workable gain reduction from the beginning to the end of the band. This gain reduction, also called gain slope, is detrimental to the RF power circuit operation and is out of customer specification requirements.

Accordingly, there is a need for implementing a RF power amplifier configured to limit changes in gain including gain slope. Moreover, there is a need for implementing a RF power amplifier configured to limit changes in gain including gain slope while limiting cost. Additionally, there is a need for implementing a RF power amplifier configured to limit changes in gain including gain slope while limiting complexity. Further, there is a need for implementing a RF power amplifier configured to limit changes in gain including gain slope while limiting component count.

In particular, FIG. 13 illustrates a current RF power amplifier 1 having a RF power transistor 2. As further described below, the current RF power amplifier 1 typically has a significantly large bandwidth and gain drops significantly in the band due, primarily, to device parasitics as well as other device performance characteristics of the current RF power amplifier 1. Additionally, the current RF power amplifier 1 includes RF amplifying devices, such as transistors, that need to be matched at their input to a chosen system impedance, such as 50 ohm. In this regard, the current RF power amplifier 1 may typically include an input matching circuit 3.

FIG. 14 illustrates a gain performance 4 of the current RF power amplifier 1 illustrated in FIG. 13. In particular, the gain performance 4 illustrated in FIG. 14 provides values for a gain (dB) along the y-axis and power out (dBm) for the current RF power amplifier 1 along the X axis. Moreover, the gain performance 4 shows the gain (dB) and the power out (dBm) for the current RF power amplifier 1 implementing a number of different exemplary frequencies 7.

In this regard, the number of different exemplary frequencies 7 illustrated in the gain performance 4 shown in FIG. 14 have a frequency of 3.3 GHz-4.0 GHz, which is about a 20% relative bandwidth. However, the particular frequencies illustrated in FIG. 14 are merely exemplary data relating to implementation of the current RF power amplifier 1.

Additionally, the gain performance 4 illustrated in FIG. 14 provides two tables of values of the gain (dB) at a power out (dBm) of 30.347 and values of the gain (dB) at a power out (dBm) of 41.703 for the number of different exemplary frequencies 7. As illustrated in FIG. 14, the gain performance 4 shows that the gain (dB) varies from approximately 35.4 dB down to approximately 30.9 dB at a power out (dBm) of 30.347 in the band. Accordingly, the gain performance 4 of the current RF power amplifier 1 varies approximately 4.5 dB at a power out (dBm) of 30.347.

Accordingly, the current RF power amplifier 1 implementing a larger bandwidth negatively impacts performance as gain drops significantly in the RF band due, primarily, to device parasitics as well as other device performance characteristics. For example, as described above the total gain slope is detrimental to the operation of the current RF power amplifier 1 and is out of customer specification requirements.

FIG. 15 illustrates a current system 5. If a flat gain is desired, a gain equalizer needs to be added in a chain of the transmission of the current system 5. In this regard, the current system 5 may utilize an equalizer 6 as illustrated in FIG. 15. However, the equalizer 6 is typically implemented in the current system 5 separate from the current RF power amplifier 1. In this regard, the equalizer 6 is implemented separate from the current RF power amplifier 1, the equalizer 6 is implemented separate from a package of the current RF power amplifier 1, the equalizer 6 is implemented separate from the input matching circuit 3, and/or the like. Accordingly, the current system 5 implementing the equalizer 6 has increased component count, increased cost, increased complexity, and/or the like.

FIG. 16 illustrates the input matching circuit 3 for the current system 5. In particular, the input matching circuit 3 for the current system 5 may include an inductor 12, an inductor 13, a first capacitor 11, and a second capacitor 15.

SUMMARY OF THE DISCLOSURE

One aspect includes an amplifier that includes an input impedance matching network; at least one transistor; an input lead coupled to the at least one transistor; an output lead coupled to the at least one transistor; and a gain equalizer configured to equalize gain, where the gain equalizer is connected to components of the input impedance matching network.

One aspect includes a process of implementing an amplifier that includes providing an input impedance matching network; providing at least one transistor; providing a gain equalizer configured to equalize gain; coupling an input lead to the at least one transistor; coupling an output lead to the at least one transistor; and coupling the gain equalizer to components of the input impedance matching network.

In this regard, the disclosure combines a RF input matching circuit of a RF power amplifier with a gain equalizer, therefore reducing component count of the RF line-up, reducing cost of the RF line-up, reducing complexity of the RF line-up, and/or the like.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

4

Figure 1:
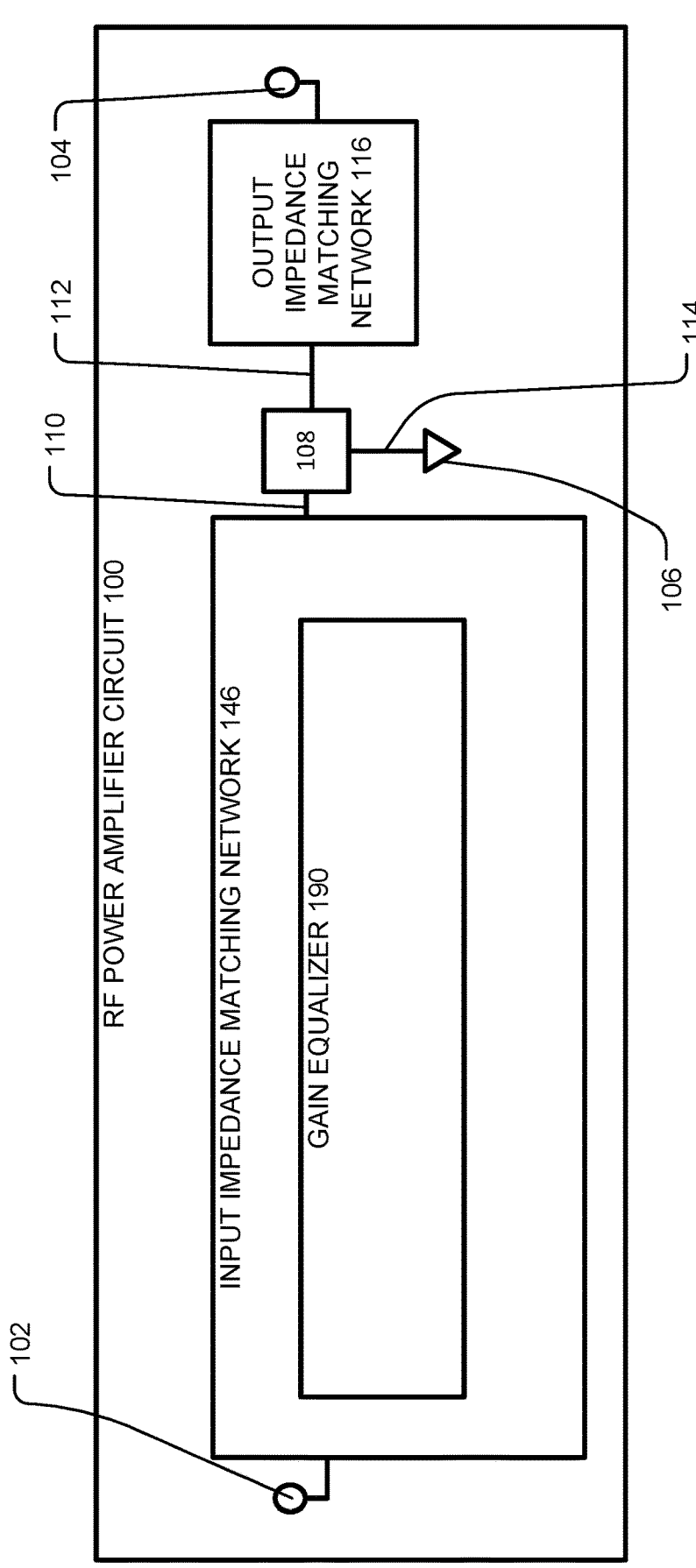
FIG. 1 illustrates a functional block diagram of a RF power amplifier circuit according to the disclosure.
Figure 7A:
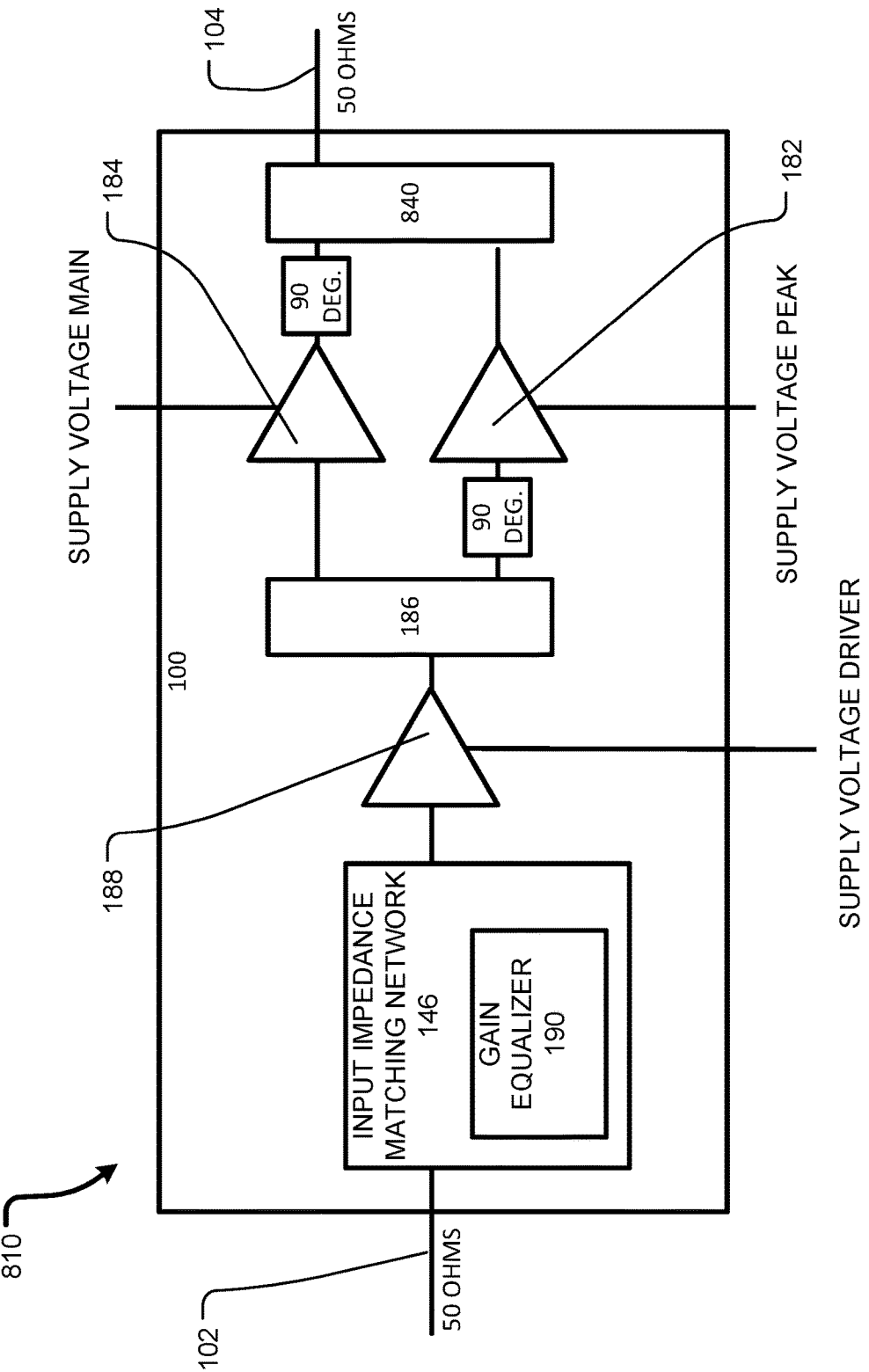
FIG. 7A illustrates a block diagram of an exemplary implementation of a RF power amplifier circuit according to FIG. 1 implemented as a multistage Doherty Power Amplifier Module (PAM).
Figure 7B:
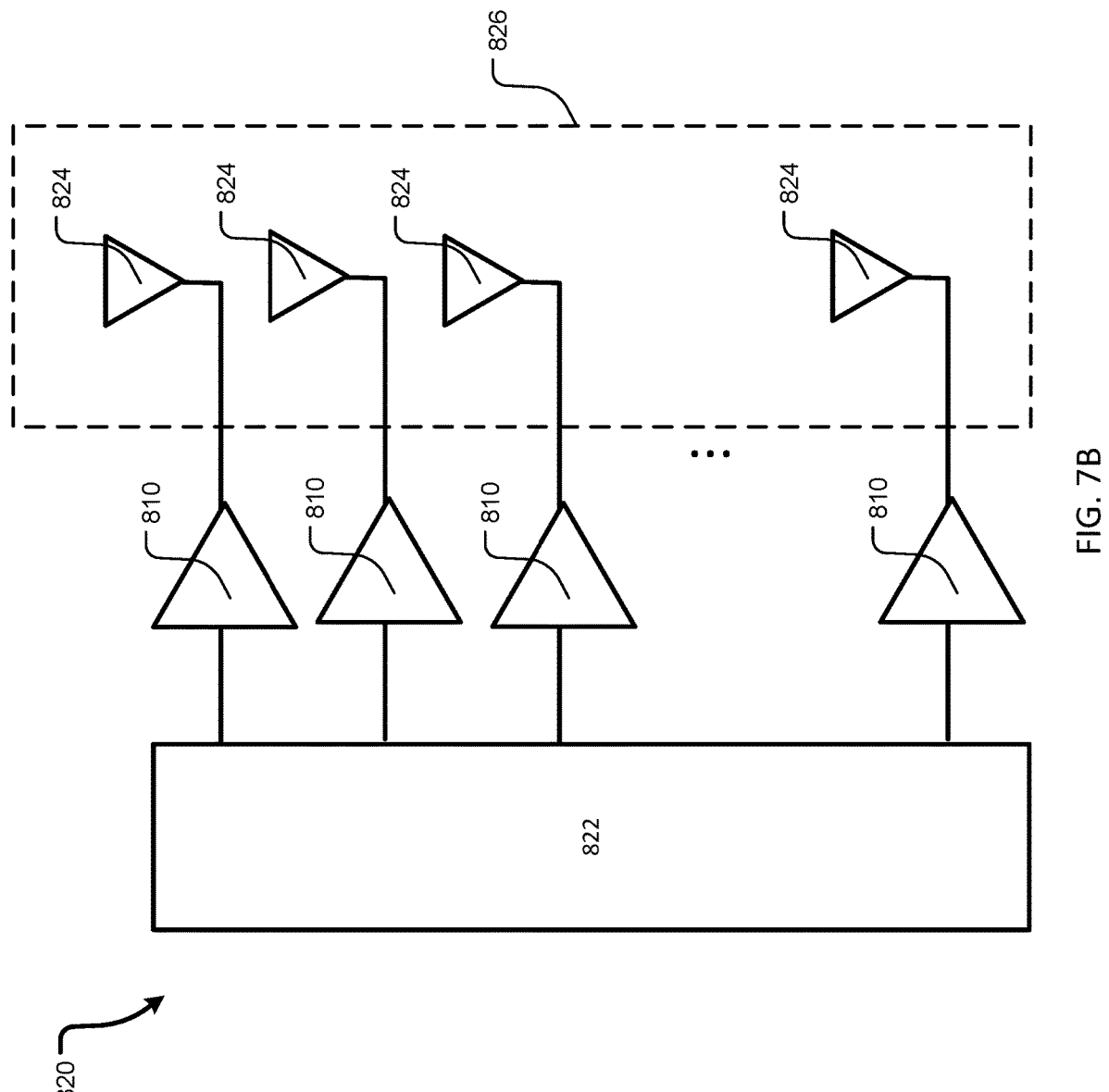
FIG. 7B illustrates a Massive Multiple-Input and Multiple-Output (MMIMO) simplified front end antenna architecture according to aspects of the disclosure.
Figure 7C:
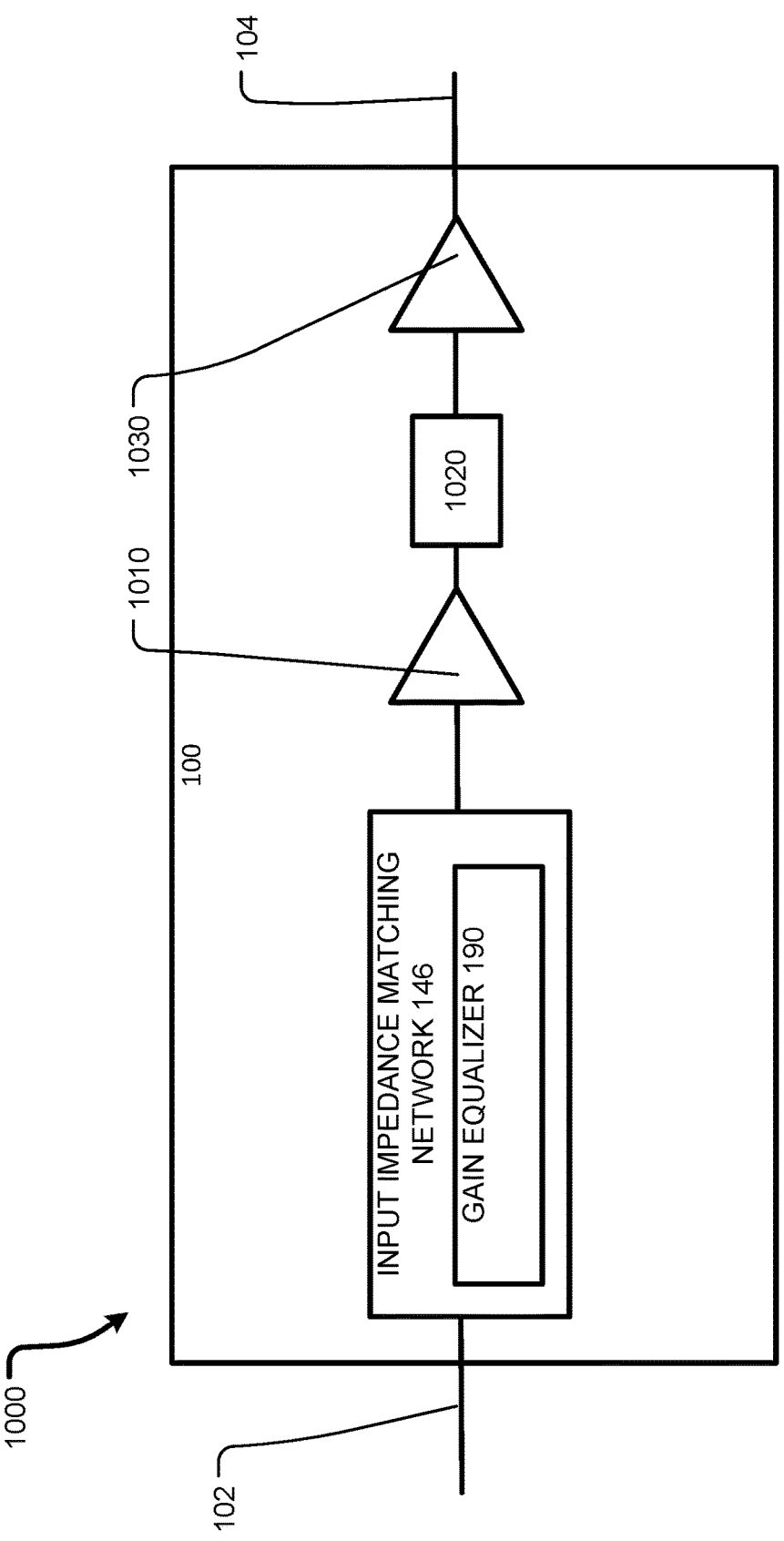
FIG. 7C illustrates a block diagram of an exemplary implementation of a RF power amplifier circuit according to FIG. 1 implemented as a single path multiple stage amplifier.
Figure 7D:
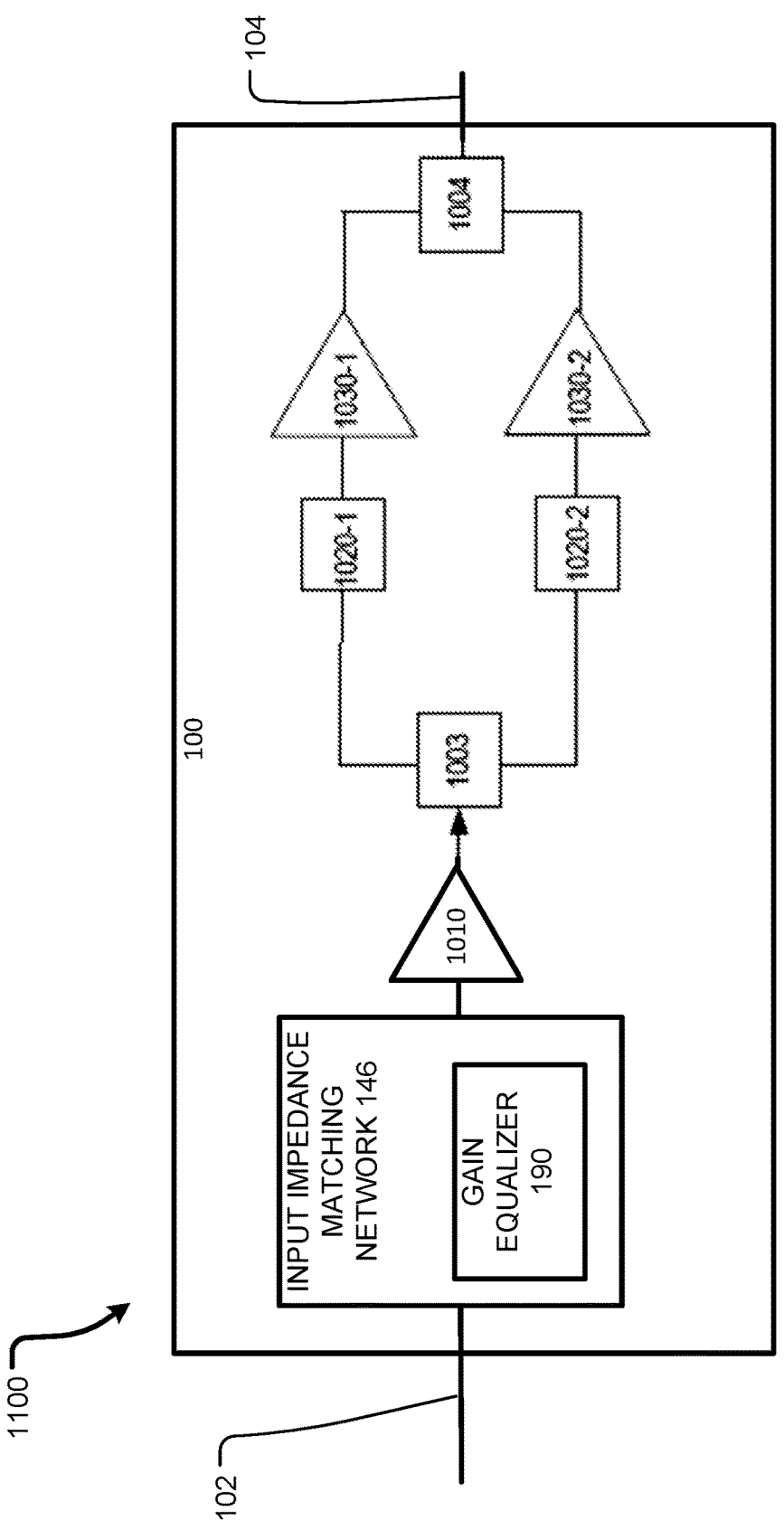

FIG. 7D illustrates a block diagram of an exemplary implementation of a RF power amplifier circuit according to FIG. 1 implemented as a multiple path multiple stage amplifier.

Figure 7E:
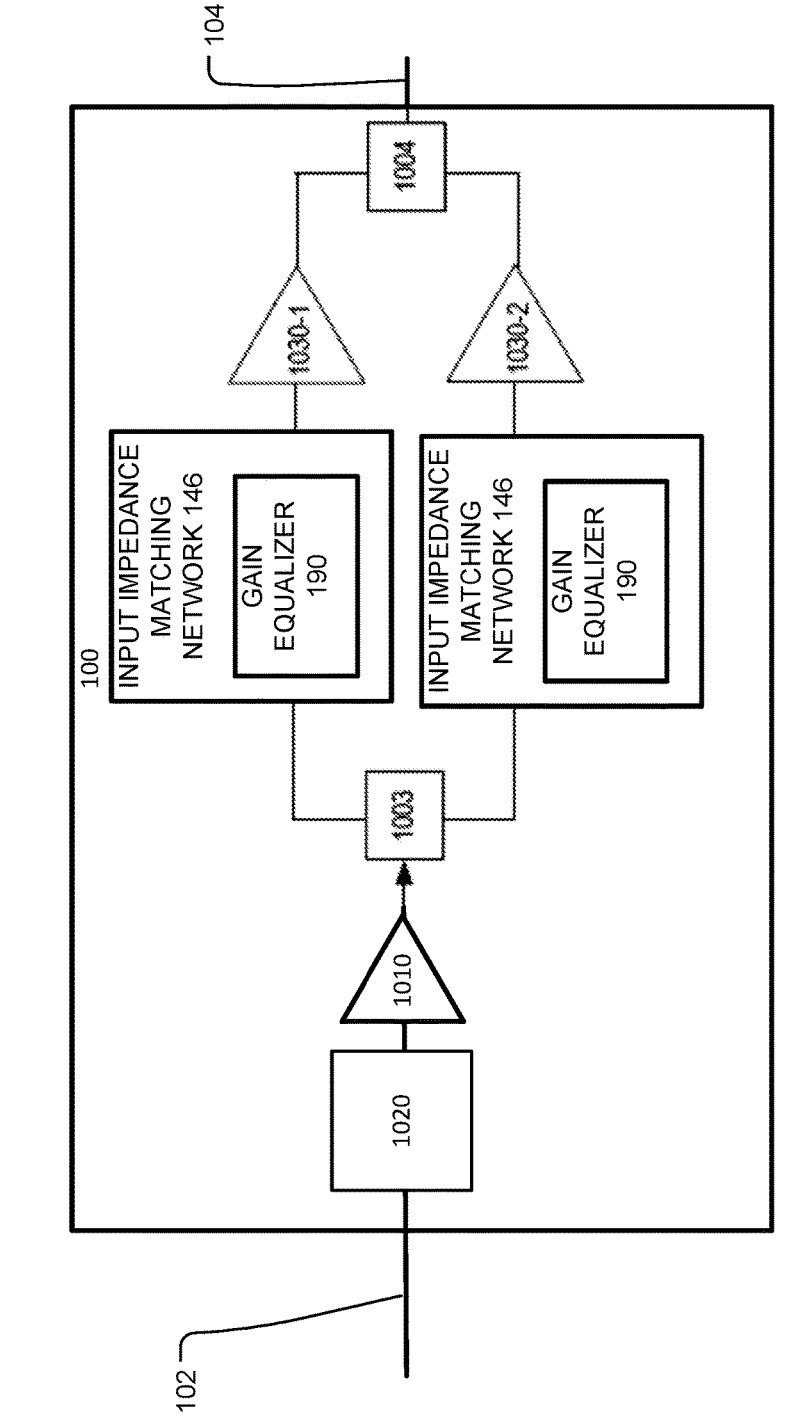

FIG. 7E illustrates a block diagram of an exemplary implementation of a RF power amplifier circuit according to FIG. 1 implemented as a multiple path multiple stage amplifier.

Figure 8:
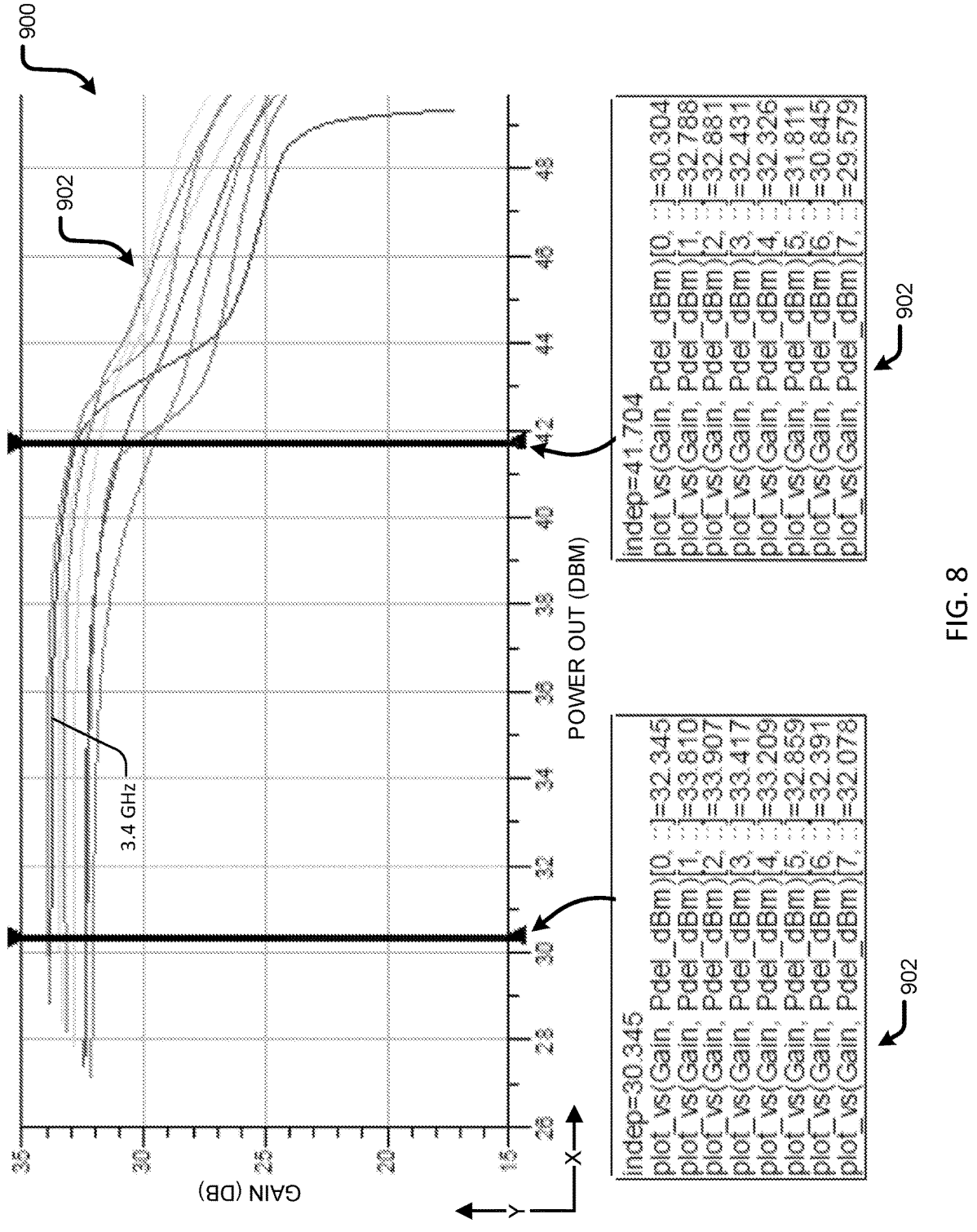

FIG. 8 illustrates a gain performance of the RF power amplifier implementing the input impedance matching network and the gain equalizer according to the disclosure.

Figure 9A:
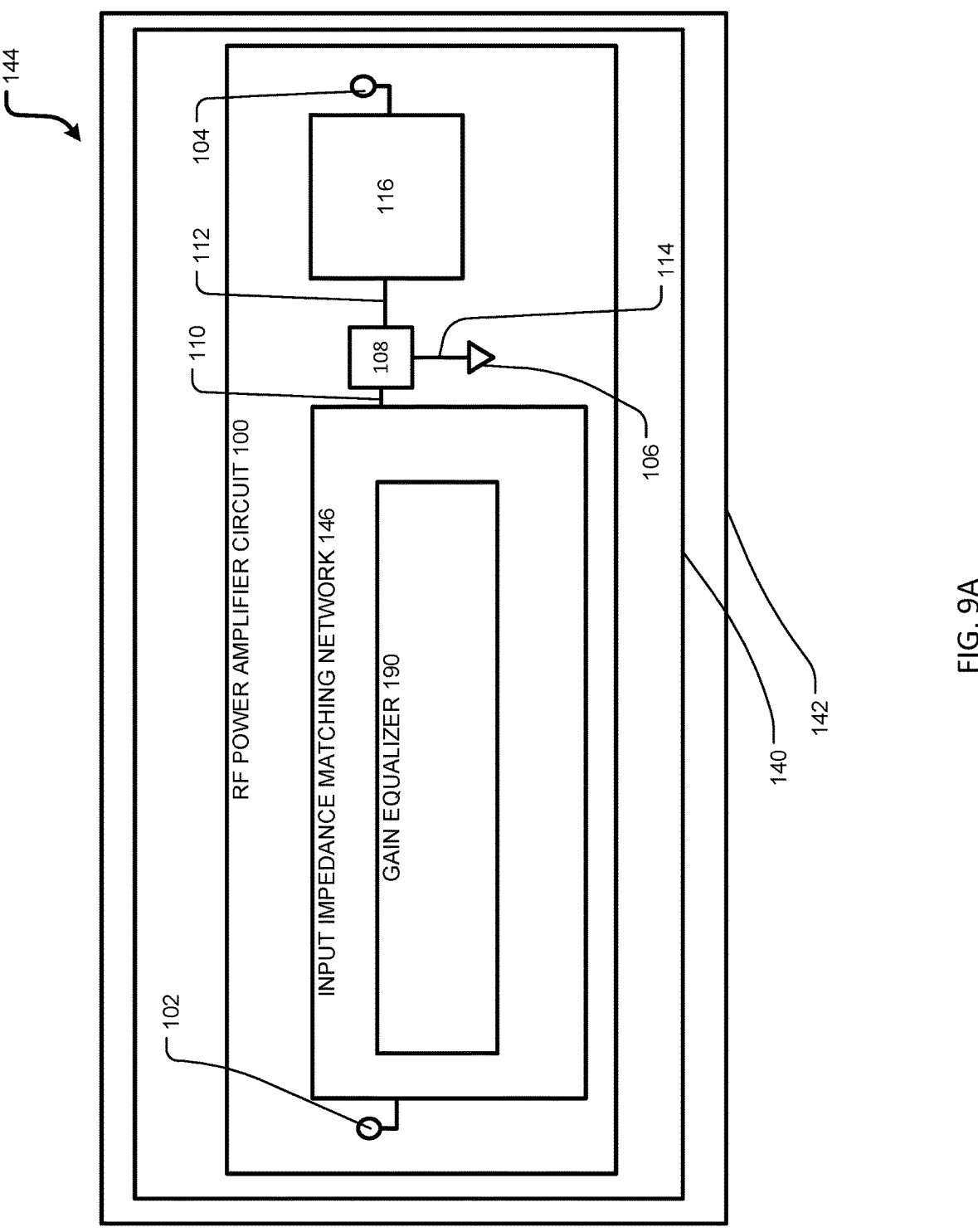

FIG. 9A illustrates an exemplary implementation of a RF power amplifier circuit according to FIG. 1.

Figure 9B:
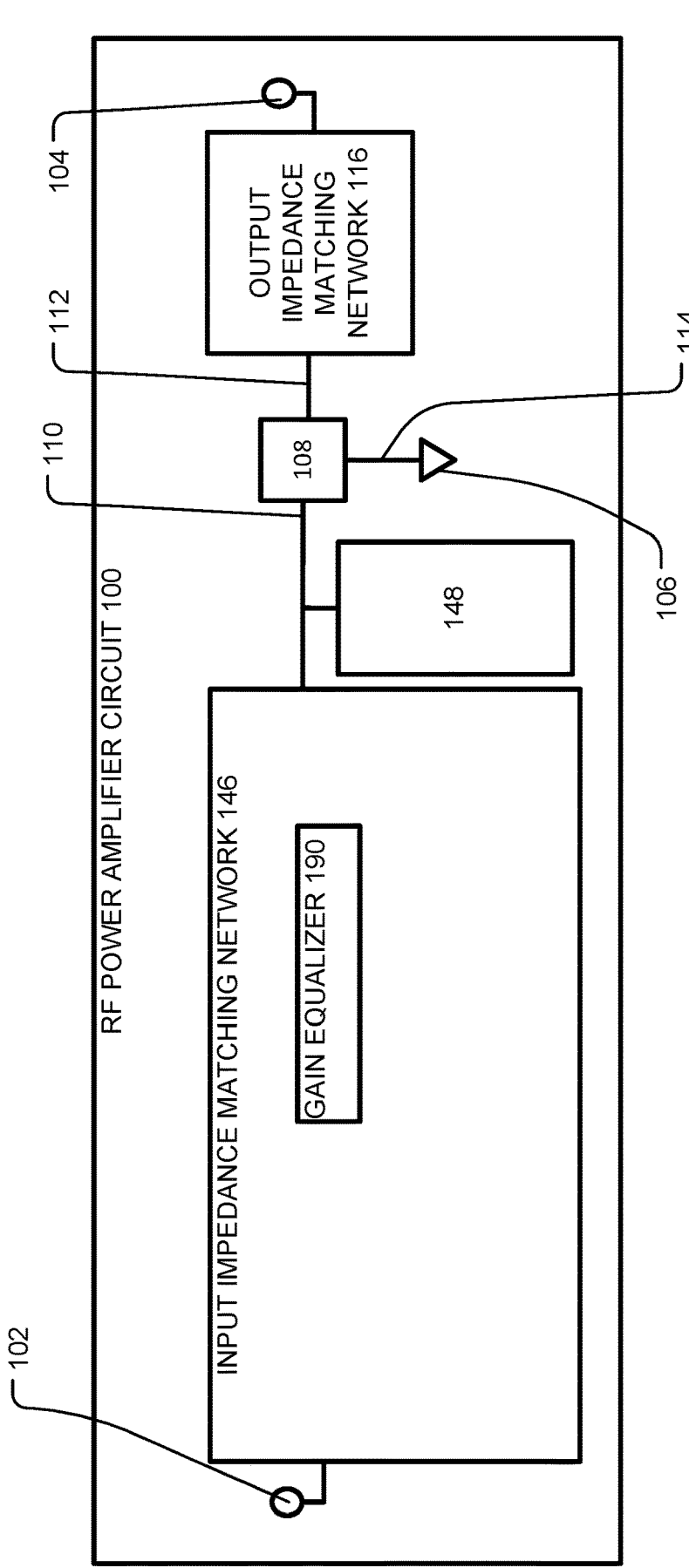

FIG. 9B illustrates another exemplary implementation of a functional block diagram of a RF power amplifier circuit according to FIG. 1.

Figure 10:
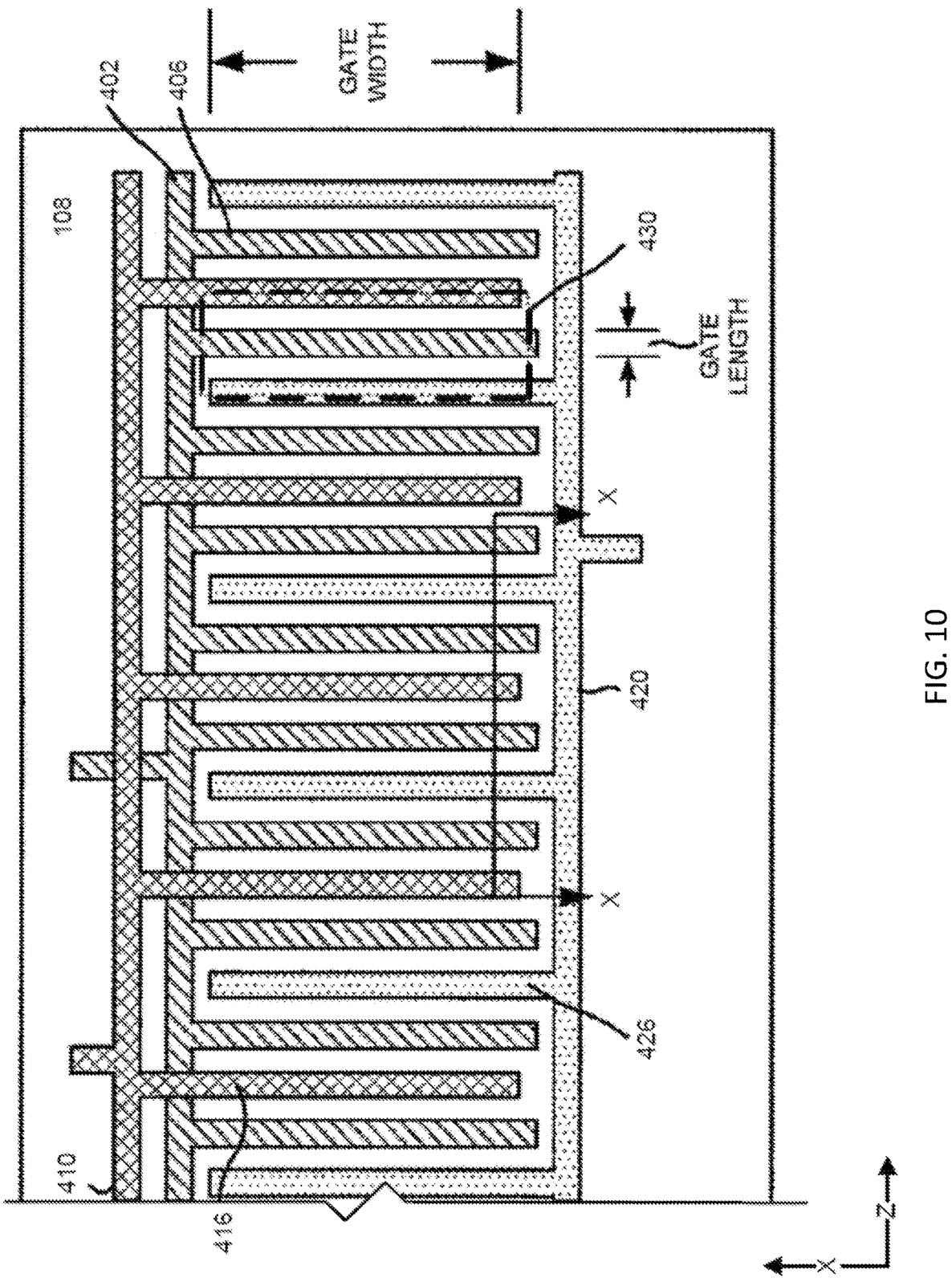

FIG. 10 is an enlarged partial schematic view of an exemplary implementation of the RF amplifier device according to the disclosure.

Figure 11:
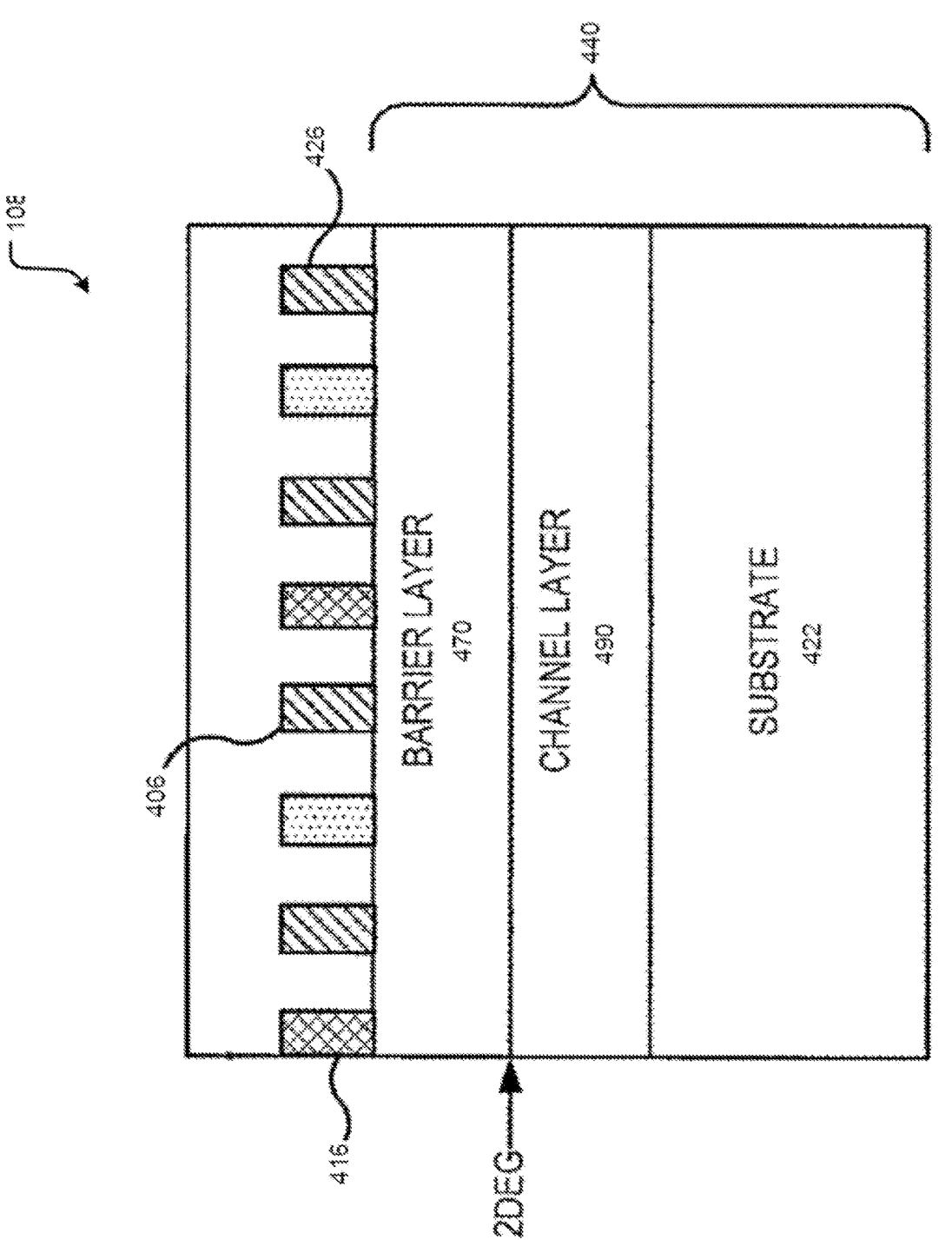

FIG. 11 is a schematic cross-sectional view taken along line X-X of FIG. 10.

Figure 12:
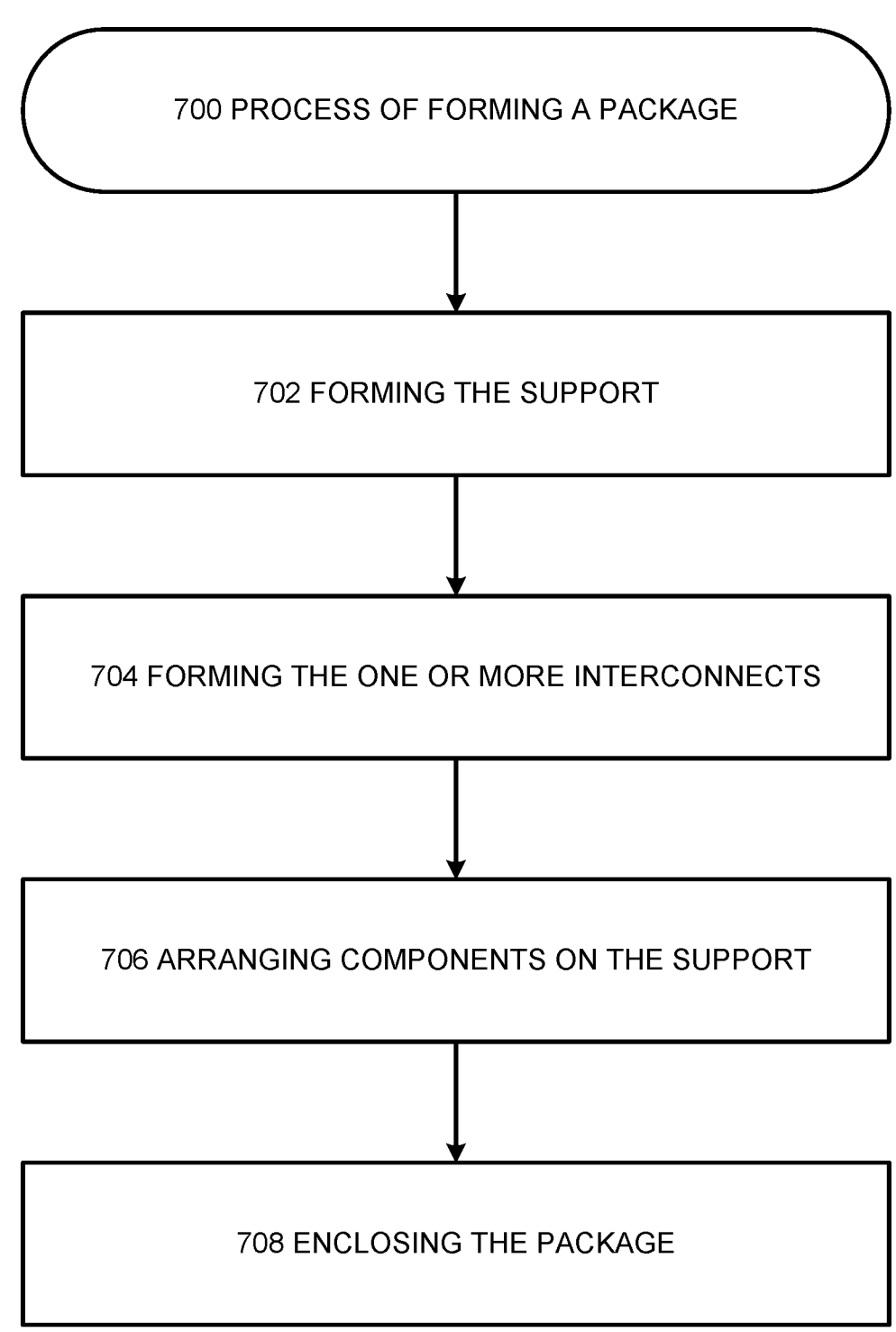

FIG. 12 illustrates a process of implementing a package according to the disclosure.

Figure 13:
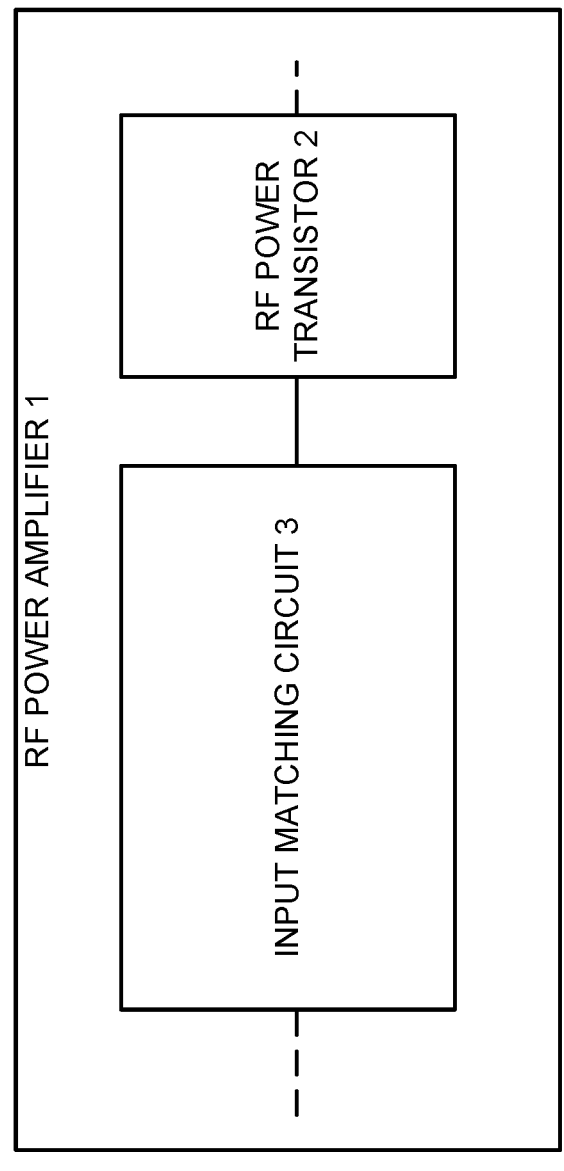

FIG. 13 illustrates a current RF power amplifier.

Figure 14:
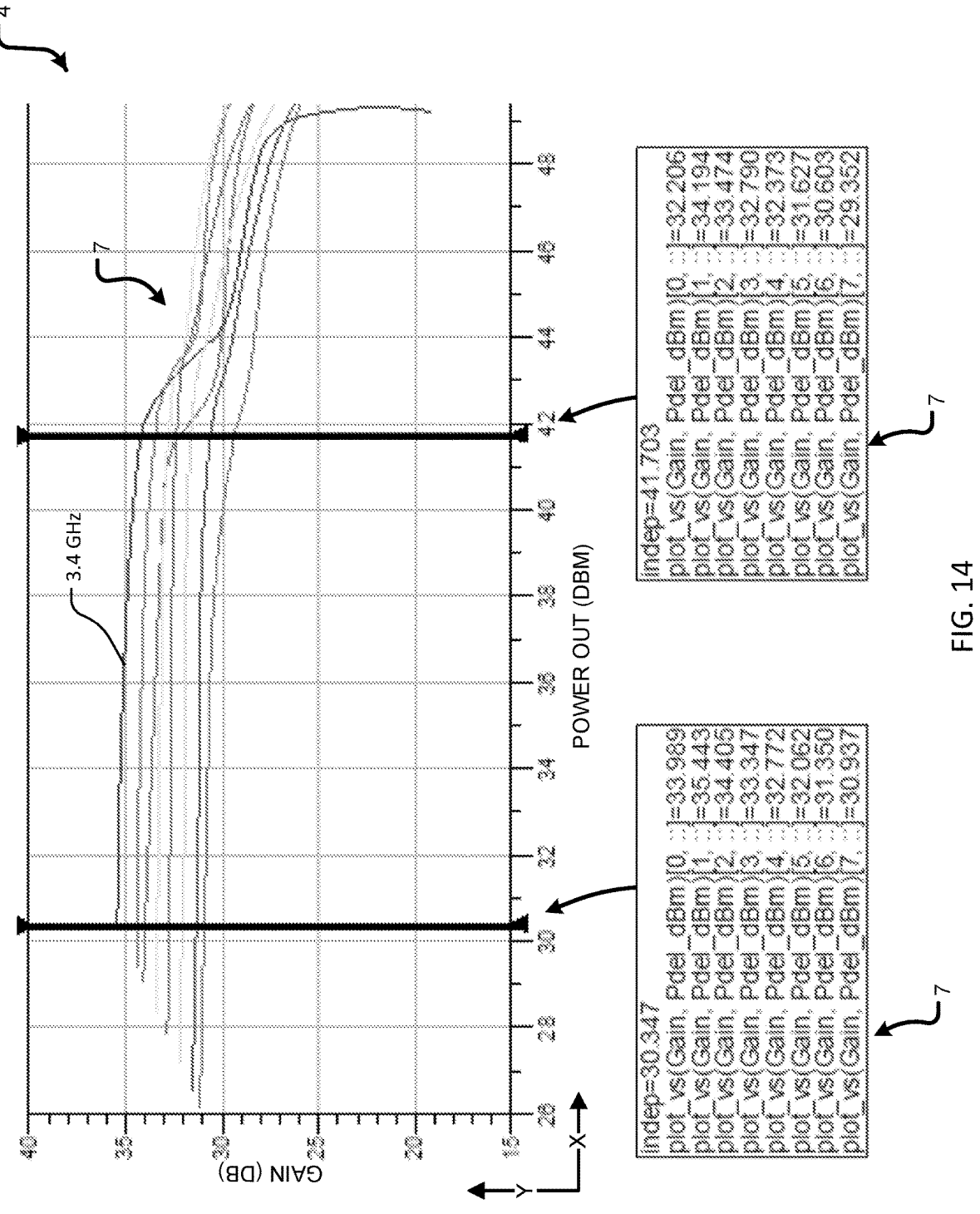

FIG. 14 illustrates a gain performance of the current RF power amplifier in FIG. 13.

Figure 15:
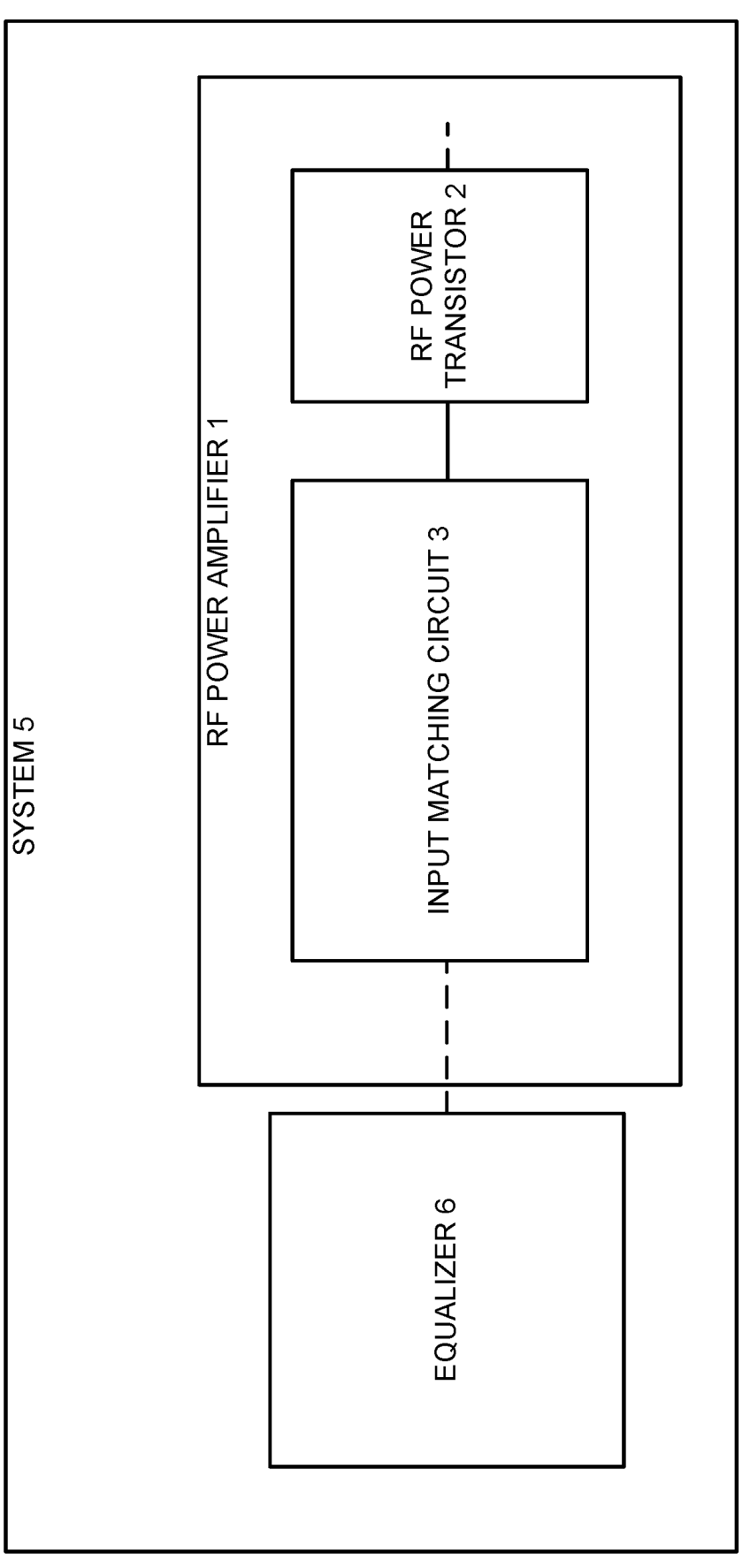

FIG. 15 illustrates another current RF power amplifier.

Figure 16:
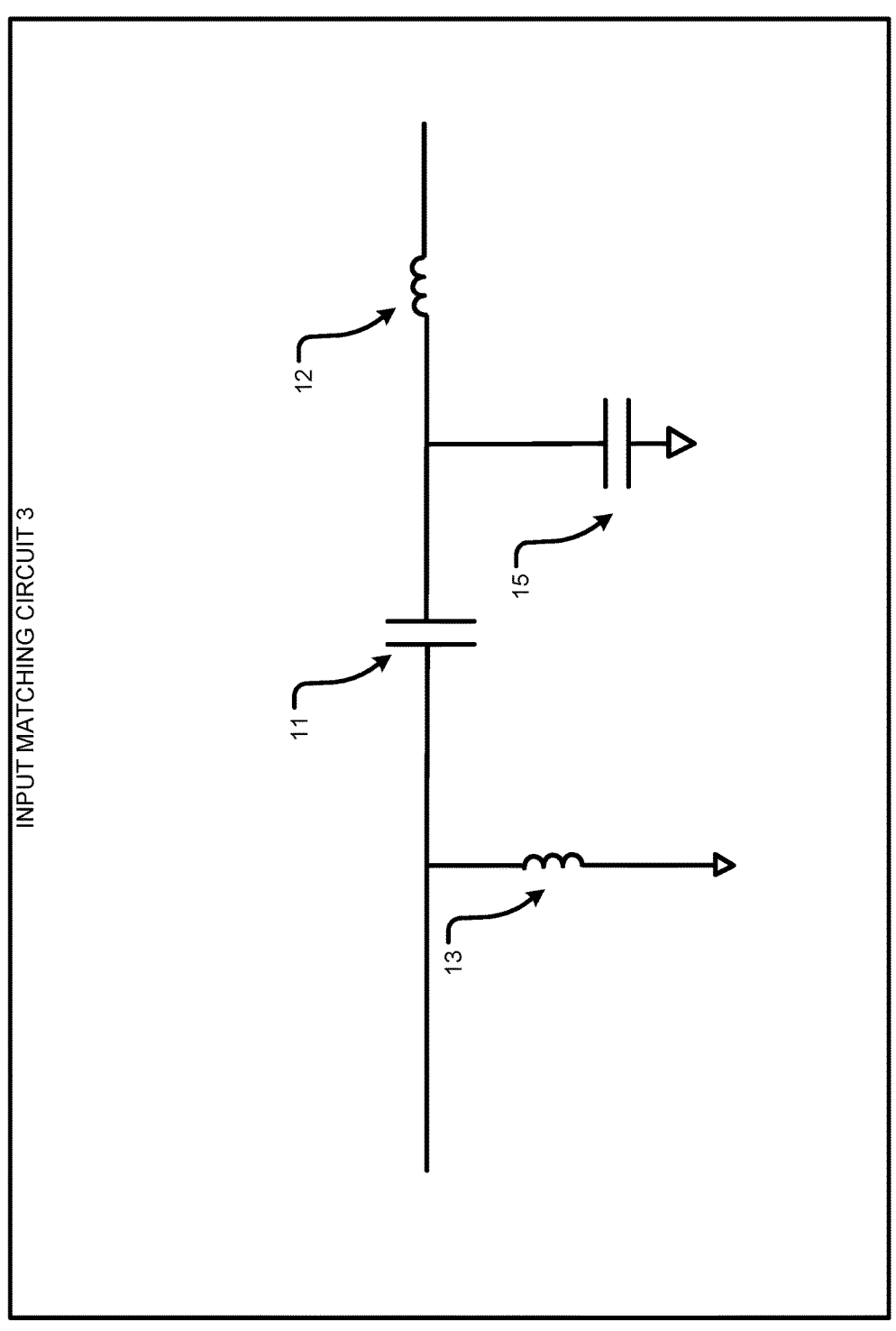

FIG. 16 illustrates an input matching circuit for the current RF power amplifier in FIG. 13.

DETAILED DESCRIPTION OF THE DISCLOSURE

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the another element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the another element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the another element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular aspects only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 illustrates a functional block diagram of a RF power amplifier circuit according to the disclosure.

In particular, FIG. 1 illustrates a RF power amplifier circuit 100. The RF power amplifier circuit 100 may include an input port 102, a RF output port 104, and a reference potential port 106. The RF power amplifier circuit 100 additionally may include a RF amplifier device 108, a gain equalizer 190, and an input impedance matching network 146. The RF amplifier device 108 may have an input terminal 110 electrically coupled to the input port 102 through the input impedance matching network 146 and/or the gain equalizer 190. The RF amplifier device 108 may include an output terminal 112 electrically coupled to the RF output port 104 and a reference potential terminal 114 electrically coupled to the reference potential port 106. Additionally, the RF power amplifier circuit 100 may further include an output impedance matching network 116 electrically coupled between the output terminal 112 and the RF output port 104. In other aspects, the RF power amplifier circuit 100 may not include the output impedance matching network 116. In aspects, the output impedance matching network 116 may be implemented separate from the RF power amplifier circuit 100.

As in all input matching circuit the values are chosen so that the device input impedance is changed to the nominal characteristic impedance (usually 50 ohm) in the pass band of the device. The values are device and frequency dependent. Additionally, the configuration is bandwidth dependent. For example, the larger the bandwidth, the more elements are required. In this particular example, four elements are required. What is to note is that the best impedance matching network (implemented traditionally as loss-less, that is with no resistors) will allow for full signal transfer from the system impedance to the input impedance of the device. Consequently, because the device intrinsic gain decreases over frequency due to its parasitics, the whole amplifier gain decreases over the bandwidth. This is why equalization in the system may become necessary.

The amount of correction required to equalize the gain determines two aspects of implementing aspects of the disclosure: Firstly, if a lot of correction is needed, additional equalizing components are required. More components may be included than indicated in the drawings, however, knowledgeable designers will be cautious not to include resistors to ground if they create a leaking configuration that would be unmanageable (only non leaking configurations are shown on the drawings). Secondly the amount of correction is determined by the resistor values in comparison to 1/(2.pi-.Freq.C) in case of capacitors, 2.pi.Freq.L in case of inductors. In general, if the resistor is not on the same order of magnitude there will be no equalization, If, on the other hand, the resistor value is such that there is added loss in the input match there will be some gain degradation (as well as noise degradation if that specification is of concern). As in all designs of this sort though, the initial component calculation is followed by a detailed simulation which can modify component values. While the concept is followed, the amount of equalization from each resistor will vary based on the specific device being matched at the specific design frequency.

In one aspect, the RF power amplifier circuit 100 utilizes the gain equalizer 190 and the input impedance matching network 146 as an equalizing input matching circuit, where equalizing components of the gain equalizer 190 have been added and the gate input match of the input impedance matching network 146 may be tuned to equalize the gain as well as keep the same input impedance, such as for example an input impedance of 50 ohm. In one aspect, the RF power amplifier circuit 100 may utilize the gain equalizer 190 and the input impedance matching network 146 as an equalizing input matching circuit, where one or more resistors of the gain equalizer 190 have been added and the gate input match of the input impedance matching network 146 may be tuned to equalize the gain as well as keep the same input impedance, such as for example 50 ohm. In one aspect, the RF power amplifier circuit 100 utilizes the gain equalizer 190 and the input impedance matching network 146 as an equalizing input matching circuit, where three resistors of the gain equalizer 190 have been added and the gate input match of the input impedance matching network 146 may be tuned to equalize the gain as well as keep the same input impedance, such as for example 50 ohm. In one aspect, the RF power amplifier circuit 100 combines the RF input matching of the input impedance matching network 146 for the RF amplifier device 108 with the gain equalizer 190 therefore reducing system component count, cost and complexity.

The gain equalizer 190 may be connected to components of the input impedance matching network 146, the gain equalizer 190 may be connected to the input impedance matching network 146, the gain equalizer 190 may be connected to the RF amplifier device 108, and/or the gain equalizer 190 may be connected to the input terminal 110 of the RF amplifier device 108. The input impedance matching network 146 may be connected to components of the gain equalizer 190, the input impedance matching network 146 may be connected to the RF amplifier device 108, and/or the input impedance matching network 146 may be connected to the input terminal 110 of the RF amplifier device 108.

In one or more aspects, the gain equalizer 190 may be integrated into the RF power amplifier circuit 100, the gain equalizer 190 may be integrated into a package housing the RF power amplifier circuit 100, the gain equalizer 190 may be implemented in the RF power amplifier circuit 100 separate from a system implementing the RF power amplifier circuit 100, the gain equalizer 190 may be integrated into the input impedance matching network 146, the gain equalizer 190 may connect to components of the input impedance matching network 146, and/or the like.

In aspects, the input impedance matching network 146 may be implemented with various circuit combinations of one or more capacitors, one or more inductors, and/or the like. The disclosure provides a number of exemplary implementations of the input impedance matching network 146 with the various circuit combinations of the one or more capacitors, the one or more inductors, and/or the like. However, the input impedance matching network 146 may be implemented with a number of different other circuit combinations of one or more capacitors, one or more inductors, and/or the like.

Figure 2:
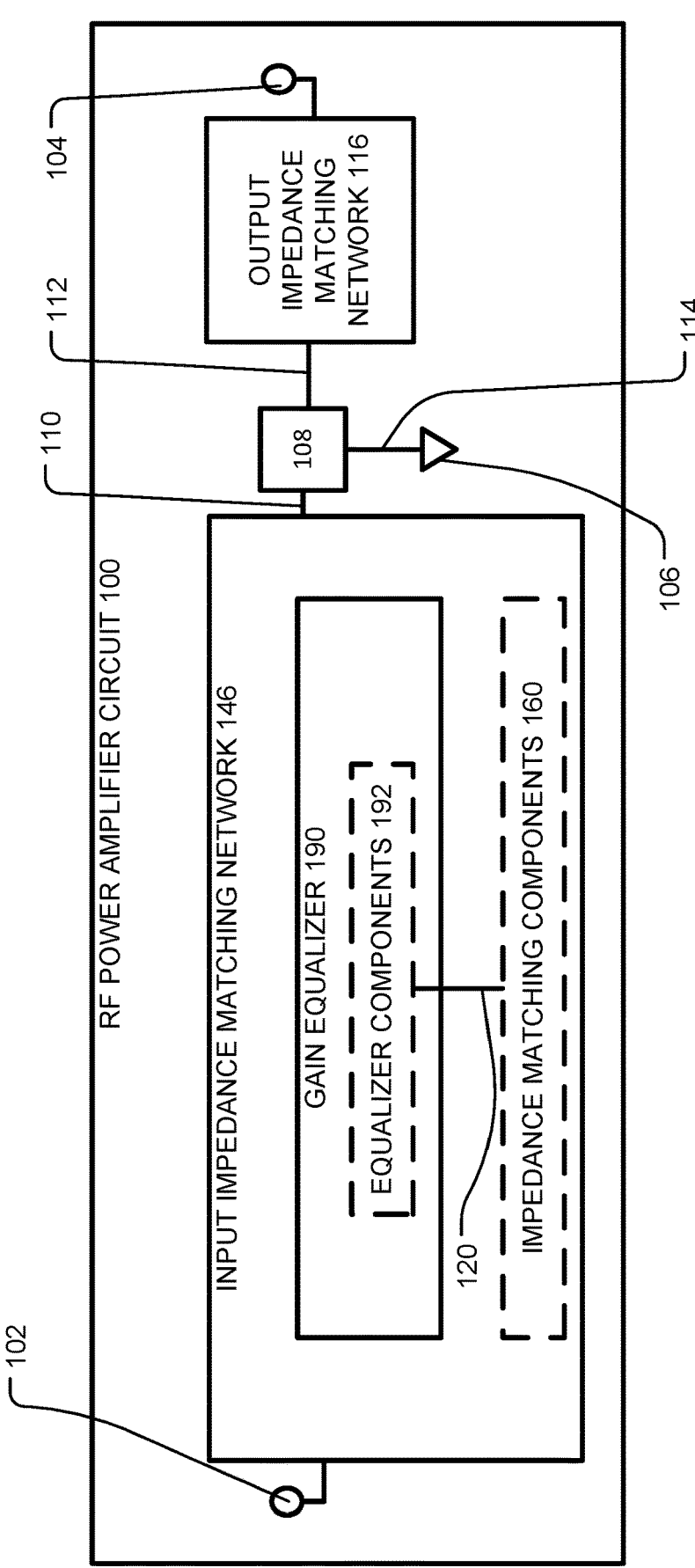
FIG. 2 illustrates an exemplary implementation of a functional block diagram of a RF power amplifier circuit according to FIG. 1.

FIG. 2 illustrates an exemplary implementation of a functional block diagram of a RF power amplifier circuit according to FIG. 1.

In particular, the aspects of FIG. 2 and the description thereof may be implemented in any other aspects and/or figures of the RF power amplifier circuit 100 as described herein. As illustrated in FIG. 2, the gain equalizer 190 may include one or more equalizer components 192. Additionally, the input impedance matching network 146 may include one or more impedance matching components 160. As illustrated in FIG. 2, the one or more equalizer components 192 of the gain equalizer 190 may be connected to the one or more impedance matching components 160 of the input impedance matching network 146 through a connection 120.

In aspects, the one or more equalizer components 192 of the gain equalizer 190 may be arranged in parallel with the one or more impedance matching components 160 of the input impedance matching network 146. In aspects, the one or more equalizer components 192 of the gain equalizer 190 may be arranged in series and/or parallel with the one or more impedance matching components 160 of the input impedance matching network 146. In aspects, the one or more equalizer components 192 of the gain equalizer 190 may be arranged in parallel with the one or more impedance matching components 160 of the input impedance matching network 146 and the one or more equalizer components 192 of the gain equalizer 190 may be arranged in series and/or parallel with the one or more impedance matching components 160 of the input impedance matching network 146.

Parameters of the one or more equalizer components 192 of the gain equalizer 190 and the parameters of the one or more impedance matching components 160 of the input impedance matching network 146 may be specifically configured, tailored, and/or integrated into the input impedance matching network 146 to control gain in a given frequency range. More specifically, the parameters of the one or more equalizer components 192 of the gain equalizer 190 and the parameters of the one or more impedance matching components 160 of the input impedance matching network 146 may be specifically configured, tailored, and/or integrated into the input impedance matching network 146 to equalize a gain, limit a gain slope, flatten a gain, provide a more consistent gain, and/or the like of the RF power amplifier circuit 100 in a given frequency range in implementations of the RF power amplifier circuit 100.

Figure 3A:
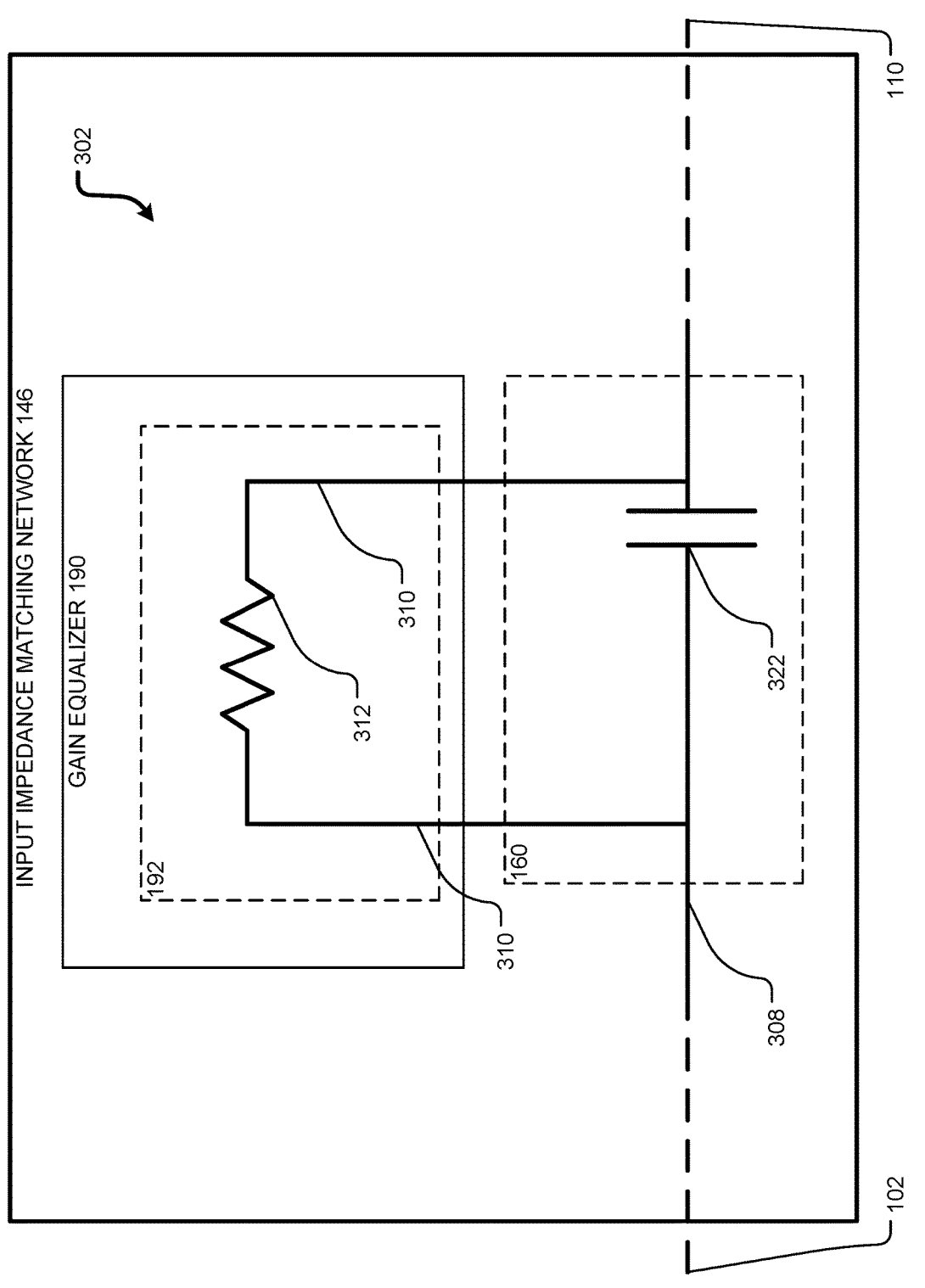
FIG. 3A illustrates an exemplary implementation of an input impedance matching network and a gain equalizer of the RF power amplifier circuit according to FIG. 1.

FIG. 3A illustrates an exemplary implementation of an input impedance matching network and a gain equalizer of the RF power amplifier circuit according to FIG. 1.

In particular, the aspects of FIG. 3A and the description thereof may be implemented in any other aspects and/or figures of the RF power amplifier circuit 100 as described herein. As illustrated in FIG. 3A, the one or more equalizer components 192 of the gain equalizer 190 and the one or more impedance matching components 160 of the input impedance matching network 146 may implement a first equalizer configuration 302.

As illustrated in FIG. 3A, the one or more equalizer components 192 of the gain equalizer 190 of the first equalizer configuration 302 may include a resistor 312. Additionally, the one or more impedance matching components 160 of the input impedance matching network 146 of the first equalizer configuration 302 may include a capacitor 322. In aspects, the one or more equalizer components 192 may implement a plurality of implementations of the resistor 312. In aspects, the one or more impedance matching components 160 of the input impedance matching network 146 may implement a plurality of implementations of the capacitor 322.

As further illustrated in FIG. 3A, the capacitor 322 of the input impedance matching network 146 may be arranged in a main RF signal line 308 extending from the input port 102 to the input terminal 110 of the RF amplifier device 108. Additionally, the resistor 312 of the one or more equalizer components 192 may be arranged in parallel with the capacitor 322 of the input impedance matching network 146. In this regard, the resistor 312 of the one or more equalizer components 192 may include connections 310 extending from the resistor 312 of the one or more equalizer components 192 to the main RF signal line 308 such that the resistor 312 of the one or more equalizer components 192 is configured to be electrically parallel to the capacitor 322 of the one or more impedance matching components 160. Accordingly, the connections 310 illustrated in FIG. 3A may be an implementation of the connection 120 of FIG. 2.

Parameters of the resistor 312 of the gain equalizer 190 and the parameters of the capacitor 322 of the input impedance matching network 146 may be specifically configured, tailored, and/or integrated into the input impedance matching network 146 to control gain in a given frequency range. More specifically, the parameters of the resistor 312 of the gain equalizer 190 and the parameters of the capacitor 322 of the input impedance matching network 146 may be specifically configured, tailored, and/or integrated into the input impedance matching network 146 to equalize a gain, limit a gain slope, flatten a gain, provide a more consistent gain, and/or the like of the RF power amplifier circuit 100 in a given frequency range in implementations of the RF power amplifier circuit 100. In this regard, a resistance of the resistor 312 may add losses at lower operating frequencies of the RF power amplifier circuit 100, which reduces gain. On the other hand, a resistance of the resistor 312 may decrease losses at higher operating frequencies of the RF power amplifier circuit 100, which increases gain. Accordingly, the resistor 312 may equalize a gain of the RF power amplifier circuit 100 when implemented in conjunction with the capacitor 322 of the first equalizer configuration 302.

Figure 3B:
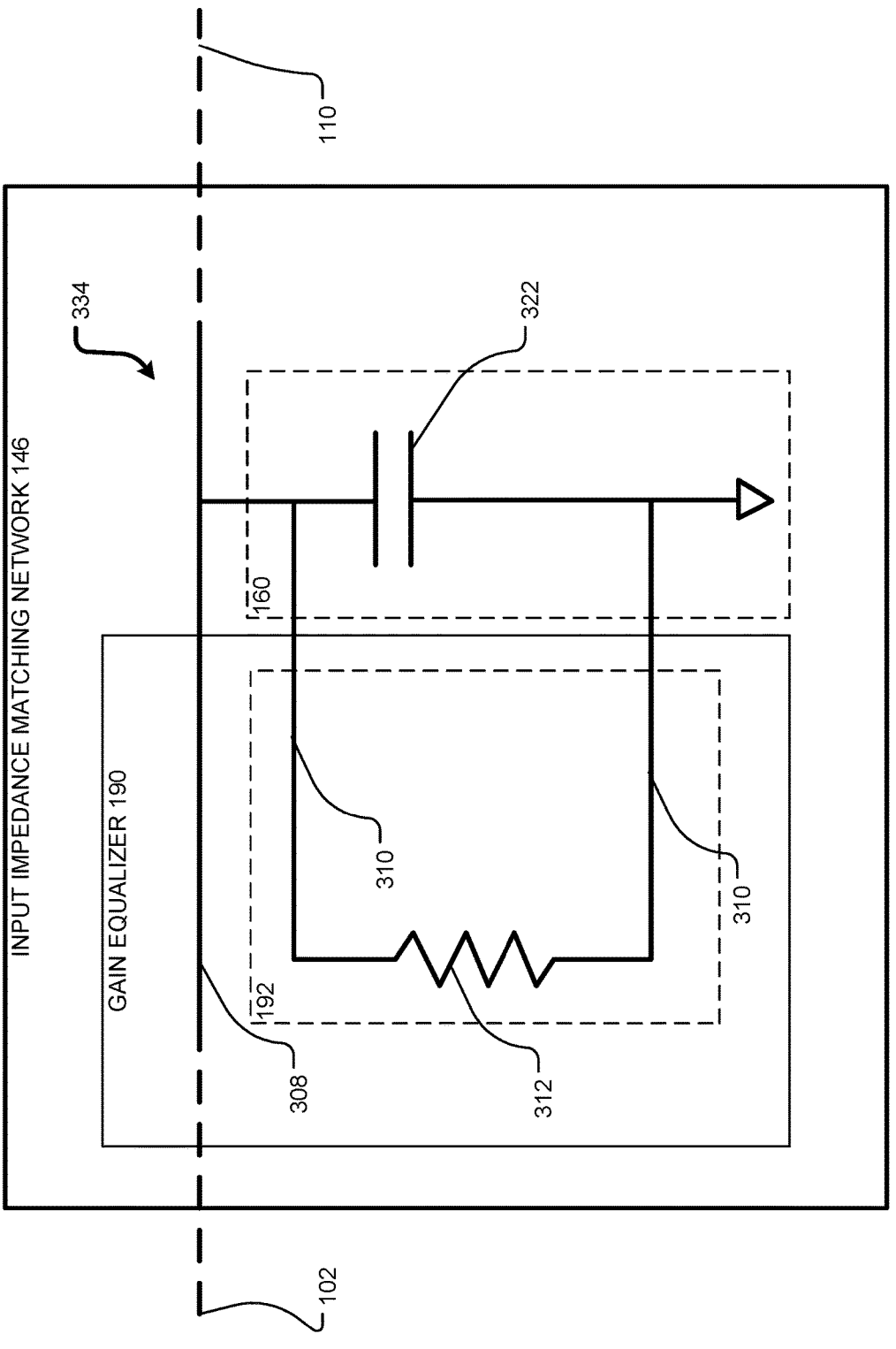
FIG. 3B illustrates another exemplary implementation of an input impedance matching network and a gain equalizer of the RF power amplifier circuit according to FIG. 1.

FIG. 3B illustrates another exemplary implementation of an input impedance matching network and a gain equalizer of the RF power amplifier circuit according to FIG. 1.

In particular, the aspects of FIG. 3B and the description thereof may be implemented in any other aspects and/or figures of the RF power amplifier circuit 100 as described herein. As illustrated in FIG. 3B, the one or more equalizer components 192 of the gain equalizer 190 and the one or more impedance matching components 160 of the input impedance matching network 146 may implement a fourth equalizer configuration 334.

As illustrated in FIG. 3B, the one or more equalizer components 192 of the gain equalizer 190 of the fourth equalizer configuration 334 may include a resistor 312. Additionally, the one or more impedance matching components 160 of the input impedance matching network 146 of the fourth equalizer configuration 334 may include a capacitor 322. In aspects, the one or more equalizer components 192 may implement a plurality of implementations of the resistor 312. In aspects, the one or more impedance matching components 160 of the input impedance matching network 146 may implement a plurality of implementations of the capacitor 322.

As further illustrated in FIG. 3B, the capacitor 322 of the input impedance matching network 146 may be connected to the main RF signal line 308 extending from the input port 102 to the input terminal 110 of the RF amplifier device 108; and the capacitor 322 of the input impedance matching network 146 may be connected to ground. Additionally, the resistor 312 of the one or more equalizer components 192 may be arranged in parallel with the capacitor 322 of the input impedance matching network 146. In this regard, the resistor 312 of the one or more equalizer components 192 may include connections 310 extending from the resistor 312 of the one or more equalizer components 192 to the capacitor 322 such that the resistor 312 of the one or more equalizer components 192 is configured to be electrically parallel to the capacitor 322 of the one or more impedance matching components 160. Accordingly, the connections 310 illustrated in FIG. 3B may be an implementation of the connection 120 of FIG. 2.

Parameters of the resistor 312 of the gain equalizer 190 and the parameters of the capacitor 322 of the input impedance matching network 146 may be specifically configured, tailored, and/or integrated into the input impedance matching network 146 to control gain in a given frequency range. More specifically, the parameters of the resistor 312 of the gain equalizer 190 and the parameters of the capacitor 322 of the input impedance matching network 146 may be specifically configured, tailored, and/or integrated into the input impedance matching network 146 to equalize a gain, limit a gain slope, flatten a gain, provide a more consistent gain, and/or the like of the RF power amplifier circuit 100 in a given frequency range in implementations of the RF power amplifier circuit 100. In this regard, a resistance of the resistor 312 may add losses at lower operating frequencies of the RF power amplifier circuit 100, which reduces gain. On the other hand, a resistance of the resistor 312 may decrease losses at higher operating frequencies of the RF power amplifier circuit 100, which increases gain. Accordingly, the resistor 312 may equalize a gain of the RF power amplifier circuit 100 when implemented in conjunction with the capacitor 322 of the fourth equalizer configuration 334.

Figure 4:
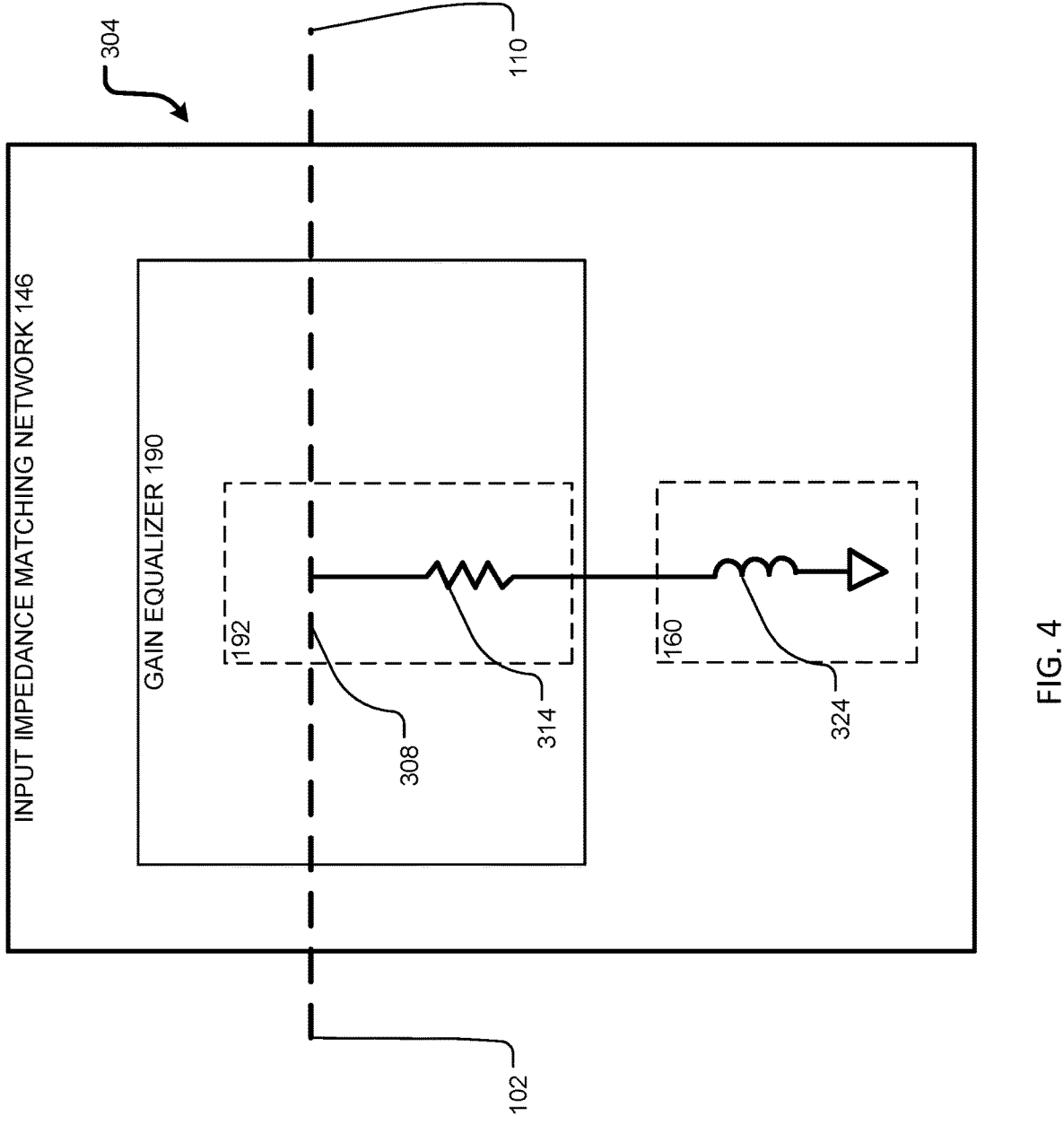
FIG. 4 illustrates an exemplary implementation of an input impedance matching network and a gain equalizer of the RF power amplifier circuit according to FIG. 1.

FIG. 4 illustrates an exemplary implementation of an input impedance matching network and a gain equalizer of the RF power amplifier circuit according to FIG. 1.

In particular, the aspects of FIG. 4 and the description thereof may be implemented in any other aspects and/or figures of the RF power amplifier circuit 100 as described herein. As illustrated in FIG. 4, the one or more equalizer components 192 of the gain equalizer 190 and the one or more impedance matching components 160 of the input impedance matching network 146 may implement a second equalizer configuration 304.

As illustrated in FIG. 4, the one or more equalizer components 192 of the gain equalizer 190 of the second equalizer configuration 304 may include a resistor 314. Additionally, the one or more impedance matching components 160 of the input impedance matching network 146 of the second equalizer configuration 304 may include an inductor 324. In aspects, the one or more equalizer components 192 may implement a plurality of implementations of the resistor 314. In aspects, the one or more impedance matching components 160 of the input impedance matching network 146 may implement a plurality of implementations of the inductor 324.

As further illustrated in FIG. 4, the inductor 324 of the input impedance matching network 146 may be arranged in series or parallel with the resistor 314 of the one or more equalizer components 192 and connected to the main RF signal line 308 extending from the input port 102 to the input terminal 110 of the RF amplifier device 108. In aspects, the resistor 314 of the one or more equalizer components 192 may be connected to the main RF signal line 308. In aspects, the resistor 314 of the one or more equalizer components 192 may be directly connected to the main RF signal line 308. In aspects, the resistor 314 of the one or more equalizer components 192 may be connected to the inductor 324. In aspects, the resistor 314 of the one or more equalizer components 192 may be directly connected to the inductor 324. In aspects, the resistor 314 of the one or more equalizer components 192 may be directly connected to the main RF signal line 308 and may be directly connected to the inductor 324. Additionally, the inductor 324 of the one or more impedance matching components 160 may be connected to a potential, ground, and/or the like. In aspects, the inductor 324 may form a shunt in the input impedance matching network 146.

Parameters of the resistor 314 of the gain equalizer 190 and the parameters of the inductor 324 of the input impedance matching network 146 may be specifically configured, tailored, and/or integrated into the input impedance matching network 146 to control gain in a given frequency range. More specifically, the parameters of the resistor 314 of the gain equalizer 190 and the parameters of the inductor 324 of the input impedance matching network 146 may be specifically configured, tailored, and/or integrated into the input impedance matching network 146 to equalize a gain, limit a gain slope, flatten a gain, provide a more consistent gain, and/or the like of the RF power amplifier circuit 100 in a given frequency range in implementations of the RF power amplifier circuit 100. In this regard, a resistance of the resistor 314 may add losses at lower operating frequencies of the RF power amplifier circuit 100, which reduces gain. On the other hand, a resistance of the resistor 314 may decrease losses at higher operating frequencies of the RF power amplifier circuit 100, which increases gain. Accordingly, the resistor 314 may equalize a gain of the RF power amplifier circuit 100 when implemented in conjunction with the inductor 324 of the second equalizer configuration 304.

Figure 5:
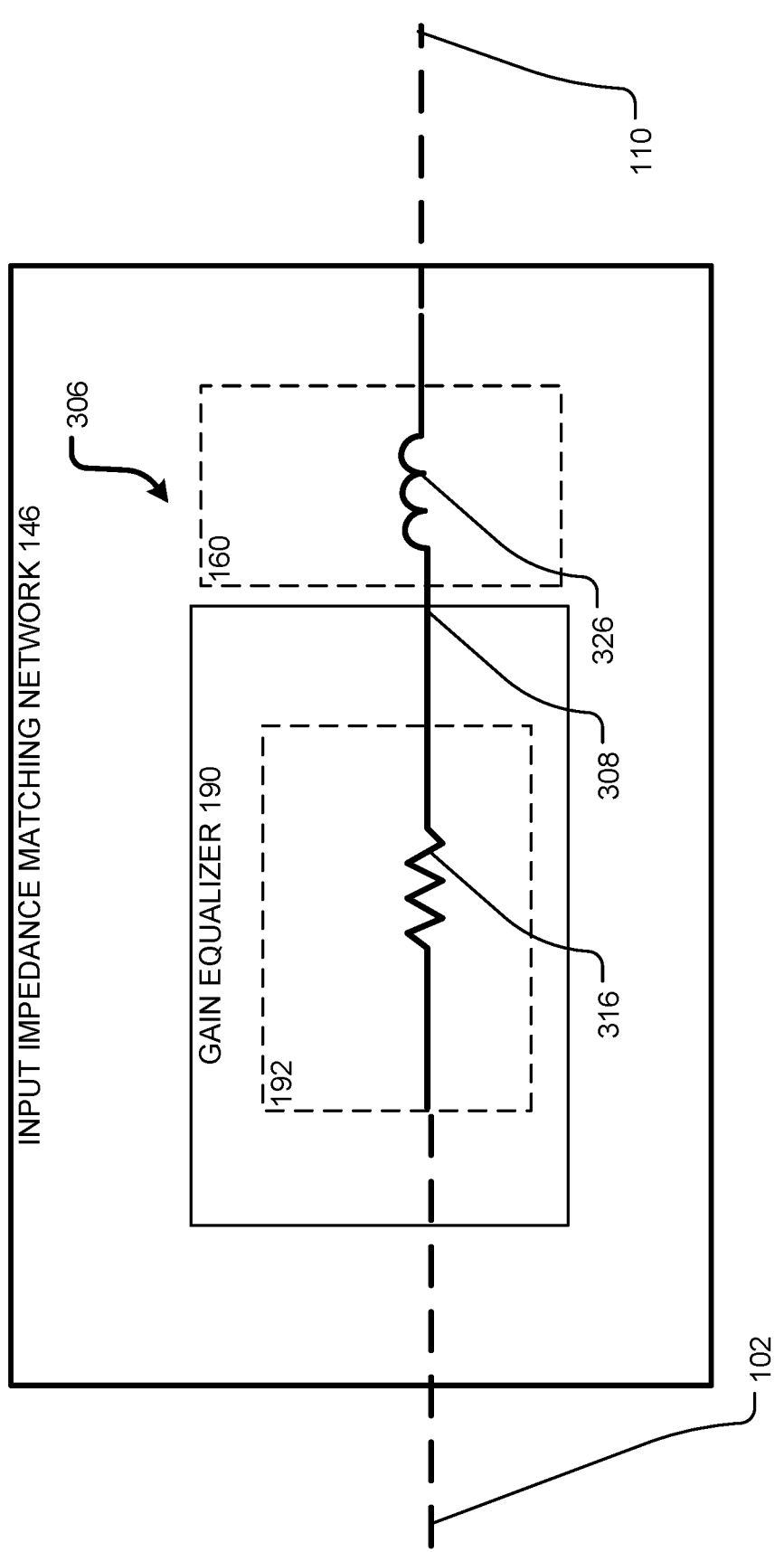
FIG. 5 illustrates an exemplary implementation of an input impedance matching network and a gain equalizer of the RF power amplifier circuit according to FIG. 1.

FIG. 5 illustrates an exemplary implementation of an input impedance matching network and a gain equalizer of the RF power amplifier circuit according to FIG. 1.

In particular, the aspects of FIG. 5 and the description thereof may be implemented in any other aspects and/or figures of the RF power amplifier circuit 100 as described herein. As illustrated in FIG. 5, the one or more equalizer components 192 of the gain equalizer 190 and the one or more impedance matching components 160 of the input impedance matching network 146 may implement a third equalizer configuration 306.

As illustrated in FIG. 5, the one or more equalizer components 192 of the gain equalizer 190 of the third equalizer configuration 306 may include a resistor 316. Additionally, the one or more impedance matching compo- nents 160 of the input impedance matching network 146 of the third equalizer configuration 306 may include an induc- tor 326. In aspects, the one or more equalizer components 192 may implement a plurality of implementations of the resistor 316. In aspects, the one or more impedance match- ing components 160 of the input impedance matching net- work 146 may implement a plurality of implementations of the inductor 326.

As further illustrated in FIG. 5, the inductor 326 of the input impedance matching network 146 may be arranged in series or parallel with the resistor 316 of the one or more equalizer components 192 within the main RF signal line 308 extending from the input port 102 to the input terminal 110 of the RF amplifier device 108. In aspects, the resistor 316 of the one or more equalizer components 192 may be connected to the input port 102. In aspects, the resistor 316 of the one or more equalizer components 192 may be connected to the inductor 326. In aspects, the resistor 316 of the one or more equalizer components 192 may be directly connected to the inductor 326. In aspects, the inductor 326 of the one or more impedance matching components 160 may be connected to the input terminal 110 of the RF amplifier device 108. In aspects, the inductor 326 of the one or more impedance matching components 160 may be directly connected to the input terminal 110 of the RF amplifier device 108.

Parameters of the resistor 316 of the gain equalizer 190 and the parameters of the inductor 326 of the input imped- ance matching network 146 may be specifically configured, tailored, and/or integrated into the input impedance match- ing network 146 to control gain in a given frequency range. More specifically, the parameters of the resistor 316 of the gain equalizer 190 and the parameters of the inductor 326 of the input impedance matching network 146 may be specifi- cally configured, tailored, and/or integrated into the input impedance matching network 146 to equalize a gain, limit a gain slope, flatten a gain, provide a more consistent gain, and/or the like of the RF power amplifier circuit 100 in a given frequency range in implementations of the RF power amplifier circuit 100. In this regard, a resistance of the resistor 316 may add losses at lower operating frequencies of the RF power amplifier circuit 100, which reduces gain. On the other hand, a resistance of the resistor 316 may decrease losses at higher operating frequencies of the RF power amplifier circuit 100, which increases gain. Accord- ingly, the resistor 316 may equalize a gain of the RF power amplifier circuit 100 when implemented in conjunction with the inductor 326 of the third equalizer configuration 306.

The following paragraphs provide exemplary values of resistance, capacitance, and inductance for an exemplary implementation of the input impedance matching network 146 and/or the gain equalizer 190 of the RF power amplifier circuit 100 implementing a particular implementation of the RF amplifier device 108. In this regard, the particular implementation of the RF amplifier device 108 is configured for operation with a particular power, particular frequency range, a particular input power, a particular amplitude, a particular number of stages, and/or the like. Moreover, the RF amplifier device 108 implements a particular transistor configuration including transistor type, transistor material type, and/or the like. Additionally, the RF power amplifier circuit 100 related to these values may have a particular number of the RF amplifier device 108 and in particular configuration of the RF amplifier device 108. Accordingly, these exemplary values of resistance, capacitance, and inductance may not be applicable to all implementations of the input impedance matching network 146 and/or the gain equalizer 190 of the RF power amplifier circuit 100. On the contrary, these exemplary values of resistance, capacitance, and inductance may be applicable for a subset of implemen- tations of the input impedance matching network 146 and/or the gain equalizer 190 of the RF power amplifier circuit 100. Accordingly, aspects of the disclosure contemplate other values of resistance, capacitance, and inductance that may be applicable for other implementations of the input imped- ance matching network 146 and/or the gain equalizer 190 of the RF power amplifier circuit 100 and such are within the scope of the disclosure in view of the implementation aspects described above in relation to the RF power ampli- fier circuit 100, the RF amplifier device 108, and/or the like.

In this regard, as wireless networks strive for higher capacity as well as higher upload speed, the RF bandwidth required out of the RF front end is progressively increasing, and as of 2022, 5G spectrum bandwidth allocated in C-Band (4 GHz) n77 is a record 900 MHz, a 23% relative bandwidth, n46 (5.2 GHz) is 775 MHz, a 14% relative bandwidth etc. The bandwidth size, as expressed in relative terms, is becoming significantly more demanding on the RF front end components. In particular, if the power amplifier needs to cover the whole bandwidth, the specification requirement of gain variation per MHz of bandwidth is more difficult to meet. Multiple-Input and Multiple-Output (MIMO) base stations are used in 5G in dense urban areas in order to increase network capacity. These MIMO base stations may use a significant number of antennas and associated power amplifiers, often 32 to 128 per base station, but even higher for massive MIMO (MMIMO) base stations. Because of efficiency requirements, GaN devices in the power amplifier may accordingly be the technology of choice. And because of the antenna configuration, gain and power level required, two stage integrated modules are typically used. Since 5G modulation signals have a high Peak to Average Power Ratio (PAPR), typically above 8 dB, and since high efficiency is also a requirement, the last amplifying stage is in a Doherty configuration, which allows a high efficiency in the linear back-off power region. The number of stages is another contributing factor to the gain variation over the band as each stage commonly contributes a similar amount of gain variation. This combination of factors makes it difficult to meet the total gain variation, or gain slope, without an equalizer component added in the system. The GaN device used at the input stage is sized to meet the power require- ment of a 2 stage 30 dB gain and >50 dBm peak power. In C-Band region, a greater than 600 MHz bandwidth, a GaN input match will typically require four components to match the gate to the 50 ohm characteristic impedance of the system. Aspects of the disclosure are configured to incor- porate equalizing components inside the input match to eliminate the need for a system equalizer. Since aspects of the disclosure provide the ability to match semiconductor input impedance (such as the Gate impedance if a FET is used), to 50 ohm characteristic impedance, all component values are chosen to meet a design requirement. Accordingly, the indicated values are for illustration purposes, are dependent on system frequency, semiconductor device technology and power level, and/or the like.

In exemplary nonlimiting implementations of the input impedance matching network 146 and/or the gain equalizer 190 as described above, the resistor 312 may have a resistance of 5 ohm-300 ohm, 5 ohm-25 ohm, 25 ohm-75 ohm, 75 ohm-100 ohm, 100 ohm-150 ohm, 150 ohm-200 ohm, or 200 ohm-300 ohm. In exemplary nonlimiting implementations of the input impedance matching network 146 and/or the gain equalizer 190, the resistor 312 may have a resistance of less than 1.5 ohm, less than 2 ohm, less than 3 ohm, less than 4 ohm, or less than 5 ohm. In exemplary nonlimiting implementations of the input impedance matching network 146 and/or the gain equalizer 190, the resistor 312 may have a resistance of greater than 0.5 ohm, greater than 1.5 ohm, greater than 2 ohm, greater than 3 ohm, or greater than 4 ohm.

In exemplary nonlimiting implementations of the input impedance matching network 146 and/or the gain equalizer 190 as described above, the resistor 314 may have a resistance of 0.5 ohm-15 ohm, 0.5 ohm-1.5 ohm, 1.5 ohm-2 ohm, 2 ohm-3 ohm, 3 ohm-4 ohm, 4 ohm-5 ohm, or 5 ohm-15 ohm. In exemplary nonlimiting implementations of the input impedance matching network 146 and/or the gain equalizer 190, the resistor 314 may have a resistance of less than 2 ohm, less than 3 ohm, less than 4 ohm, less than 5 ohm, or less than 5 ohm. In exemplary nonlimiting implementations of the input impedance matching network 146 and/or the gain equalizer 190, the resistor 314 may have a resistance of greater than 0.5 ohm, greater than 1.5 ohm, greater than 2 ohm, greater than 3 ohm, or greater than 4 ohm.

In exemplary nonlimiting implementations of the input impedance matching network 146 and/or the gain equalizer 190 as described above, the resistor 316 may have a resistance of 0.1 ohm-5 ohm, 0.1 ohm-0.5 ohm, 0.5 ohm-1.5 ohm, 1.5 ohm-2 ohm, 2 ohm-3 ohm, 3 ohm-4 ohm, or 4 ohm-5 ohm. In exemplary nonlimiting implementations of the input impedance matching network 146 and/or the gain equalizer 190, the resistor 316 may have a resistance of less than 1.5 ohm, less than 2 ohm, less than 3 ohm, less than 4 ohm, or less than 5 ohm. In exemplary nonlimiting implementations of the input impedance matching network 146 and/or the gain equalizer 190, the resistor 316 may have a resistance of greater than 0.5 ohm, greater than 1.5 ohm, greater than 2 ohm, greater than 3 ohm, or greater than 4 ohm.

In exemplary nonlimiting implementations of the input impedance matching network 146 and/or the gain equalizer 190 as described above, the capacitor 322 may have a capacitance of 0.5 pF-16 pF, 0.5 pF-1.5 pF, 1.5 pF-2 pF, 2 pF-3 pF, 3 pF-4 pF, 4 pF-5 pF, or 5 pF-16 pF. In exemplary nonlimiting implementations of the input impedance matching network 146 and/or the gain equalizer 190, the capacitor 322 may have a capacitance of less than 2 pF, less than 3 pF, less than 4 pF, less than 5 pF, or less than 5 pF. In exemplary nonlimiting implementations of the input impedance matching network 146 and/or the gain equalizer 190, the capacitor 322 may have a capacitance of greater than 0.5 pF, greater than 2 pF, greater than 3 pF, greater than 4 pF, or greater than 5 pF.

In exemplary nonlimiting implementations of the input impedance matching network 146 and/or the gain equalizer

190 as described above, the inductor 324 may have an inductance of 0.1 nH-6 nH, 0.1 nH-1.5 nH, 1.5 nH-2 nH, 2 nH-3 nH, 3 nH-4 nH, 4 nH-5 nH, or 5 nH-6 nH. In exemplary nonlimiting implementations of the input impedance matching network 146 and/or the gain equalizer 190, the inductor 324 may have an inductance of less than 2 nH, less than 3 nH, less than 4 nH, less than 5 nH, or less than 6 nH. In exemplary nonlimiting implementations of the input impedance matching network 146 and/or the gain equalizer 190, the inductor 324 may have an inductance of greater than 0.5 nH, greater than 1 nH, greater than 2 nH, greater than 3 nH, greater than 4 nH, or greater than 5 nH.

In exemplary nonlimiting implementations of the input impedance matching network 146 and/or the gain equalizer 190 as described above, the inductor 326 may have an inductance of 0.1 nH-6 nH, 0.1 nH-1.5 nH, 1.5 nH-2 nH, 2 nH-3 nH, 3 nH-4 nH, 4 nH-5 nH, or 5 nH-6 nH. In exemplary nonlimiting implementations of the input impedance matching network 146 and/or the gain equalizer 190, the inductor 326 may have an inductance of less than 2 nH, less than 3 nH, less than 4 nH, less than 5 nH, or less than 5 nH. In exemplary nonlimiting implementations of the input impedance matching network 146 and/or the gain equalizer 190, the inductor 326 may have an inductance greater than 0.5 nH, greater than 1 nH, greater than 2 nH, greater than 3 nH, greater than 4 nH, or greater than 5 nH.

However, aspects of the disclosure contemplate other values of resistance, capacitance, and inductance that may be applicable for other implementations of the input impedance matching network 146 and/or the gain equalizer 190 of the RF power amplifier circuit 100 and such are within the scope of the disclosure in view of the implementation aspects described above in relation to the RF power amplifier circuit 100, the RF amplifier device 108, and/or the like.

Figure 6A:
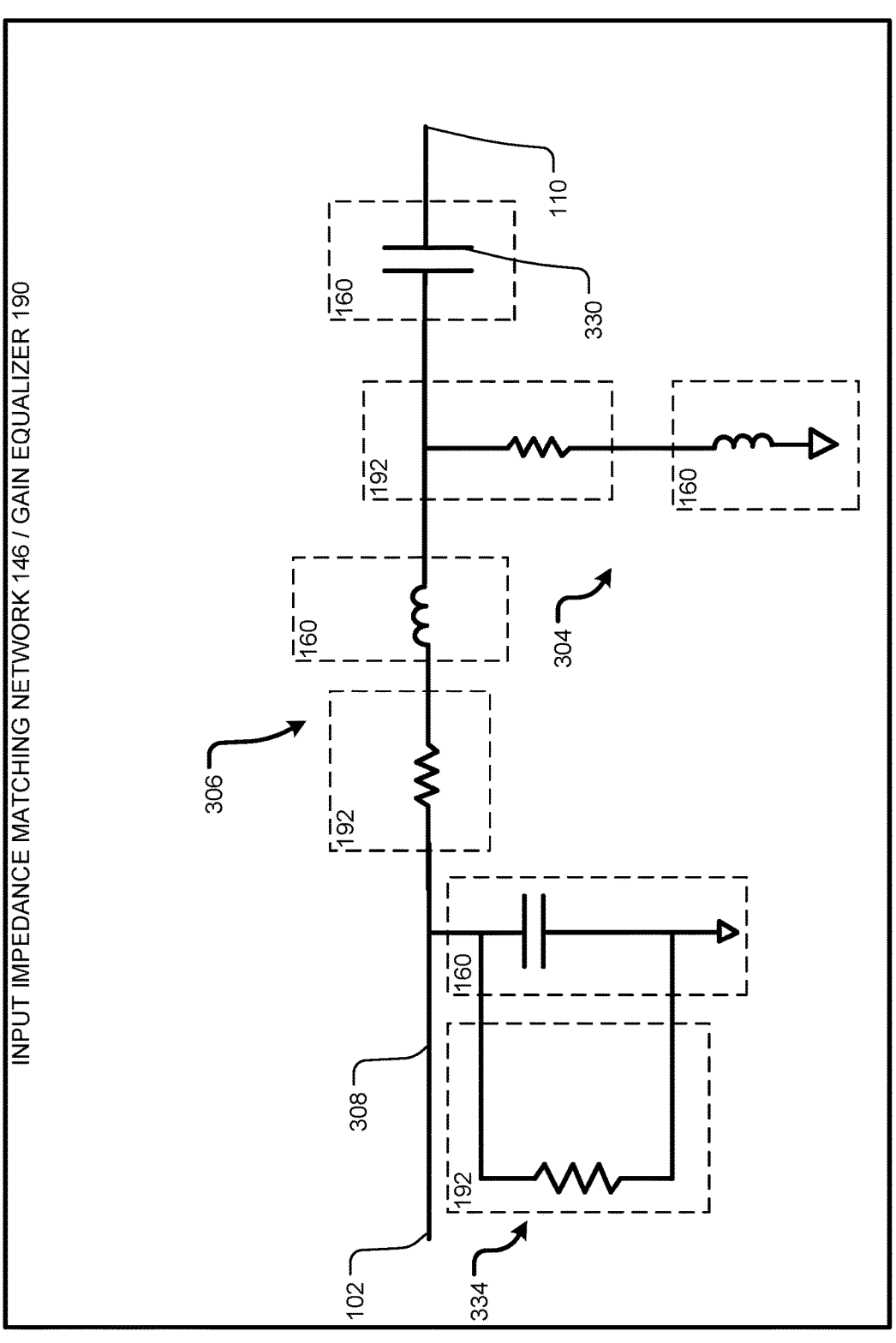
FIG. 6A illustrates an exemplary implementation of an input impedance matching network and a gain equalizer of the RF power amplifier circuit according to FIG. 1.

FIG. 6A illustrates an exemplary implementation of an input impedance matching network and a gain equalizer of the RF power amplifier circuit according to FIG. 1.

In particular, the aspects of FIG. 6A and the description thereof may be implemented in any other aspects and/or figures of the RF power amplifier circuit 100 as described herein. As illustrated in FIG. 6A, the input impedance matching network 146 and the gain equalizer 190 have been implemented with the third equalizer configuration 306, the second equalizer configuration 304, and the fourth equalizer configuration 334. In aspects, the third equalizer configuration 306 may be arranged between the fourth equalizer configuration 334 and the second equalizer configuration 304. Additionally, in aspects the input impedance matching network 146 and the gain equalizer 190 of FIG. 6A may be implemented with a capacitor 330 implemented as part of the one or more impedance matching components 160.

In this regard, a resistance of the fourth equalizer configuration 334, the second equalizer configuration 304, and the third equalizer configuration 306 may add losses at lower operating frequencies of the RF power amplifier circuit 100, which reduces gain. On the other hand, a resistance of the fourth equalizer configuration 334, the second equalizer configuration 304, and the third equalizer configuration 306 may decrease losses at higher operating frequencies of the RF power amplifier circuit 100, which increases gain. Accordingly, the fourth equalizer configuration 334, the second equalizer configuration 304, and the third equalizer configuration 306 may equalize a gain of the RF power amplifier circuit 100.

Figure 6B:
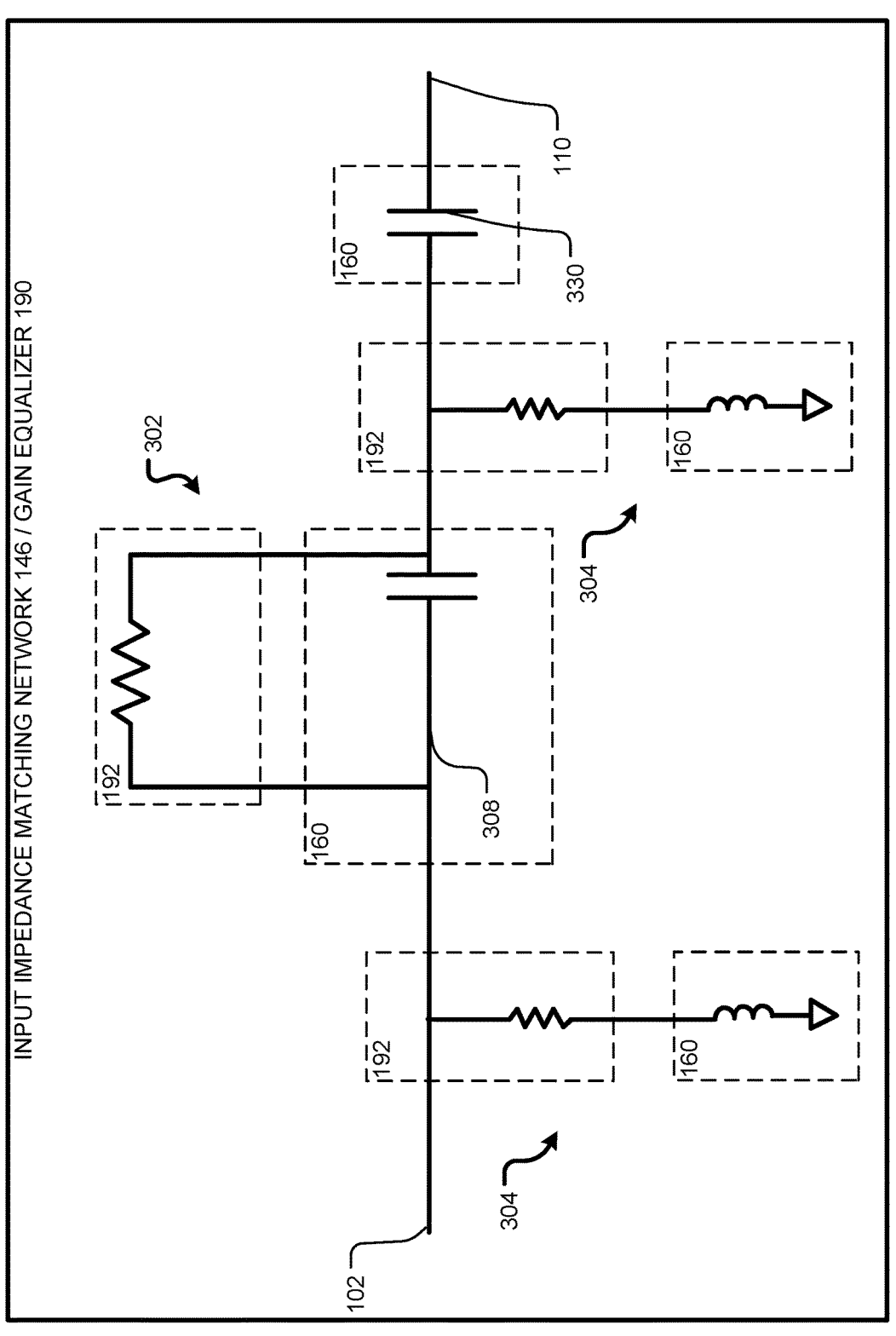
FIG. 6B illustrates an exemplary implementation of an input impedance matching network and a gain equalizer of the RF power amplifier circuit according to FIG. 1.

FIG. 6B illustrates an exemplary implementation of an input impedance matching network and a gain equalizer of the RF power amplifier circuit according to FIG. 1.

In particular, the aspects of FIG. 6B and the description thereof may be implemented in any other aspects and/or figures of the RF power amplifier circuit 100 as described herein. As illustrated in FIG. 6B, the input impedance matching network 146 and the gain equalizer 190 have been implemented with the first equalizer configuration 302, the second equalizer configuration 304, and another implementation of the second equalizer configuration 304. In aspects, the first equalizer configuration 302 may be arranged between the second equalizer configuration 304 and the another implementation of the second equalizer configuration 304. Additionally, in aspects the input impedance matching network 146 and the gain equalizer 190 of FIG. 6B may be implemented with a capacitor 330 implemented as part of the one or more impedance matching components 160.

In this regard, a resistance of the first equalizer configuration 302, the second equalizer configuration 304, and the another implementation of the second equalizer configuration 304 may add losses at lower operating frequencies of the RF power amplifier circuit 100, which reduces gain. On the other hand, a resistance of the first equalizer configuration 302, the second equalizer configuration 304, and the another implementation of the second equalizer configuration 304 may decrease losses at higher operating frequencies of the RF power amplifier circuit 100, which increases gain. Accordingly, the first equalizer configuration 302, the second equalizer configuration 304, and the another implementation of the second equalizer configuration 304 may equalize a gain of the RF power amplifier circuit 100.

Figure 6C:
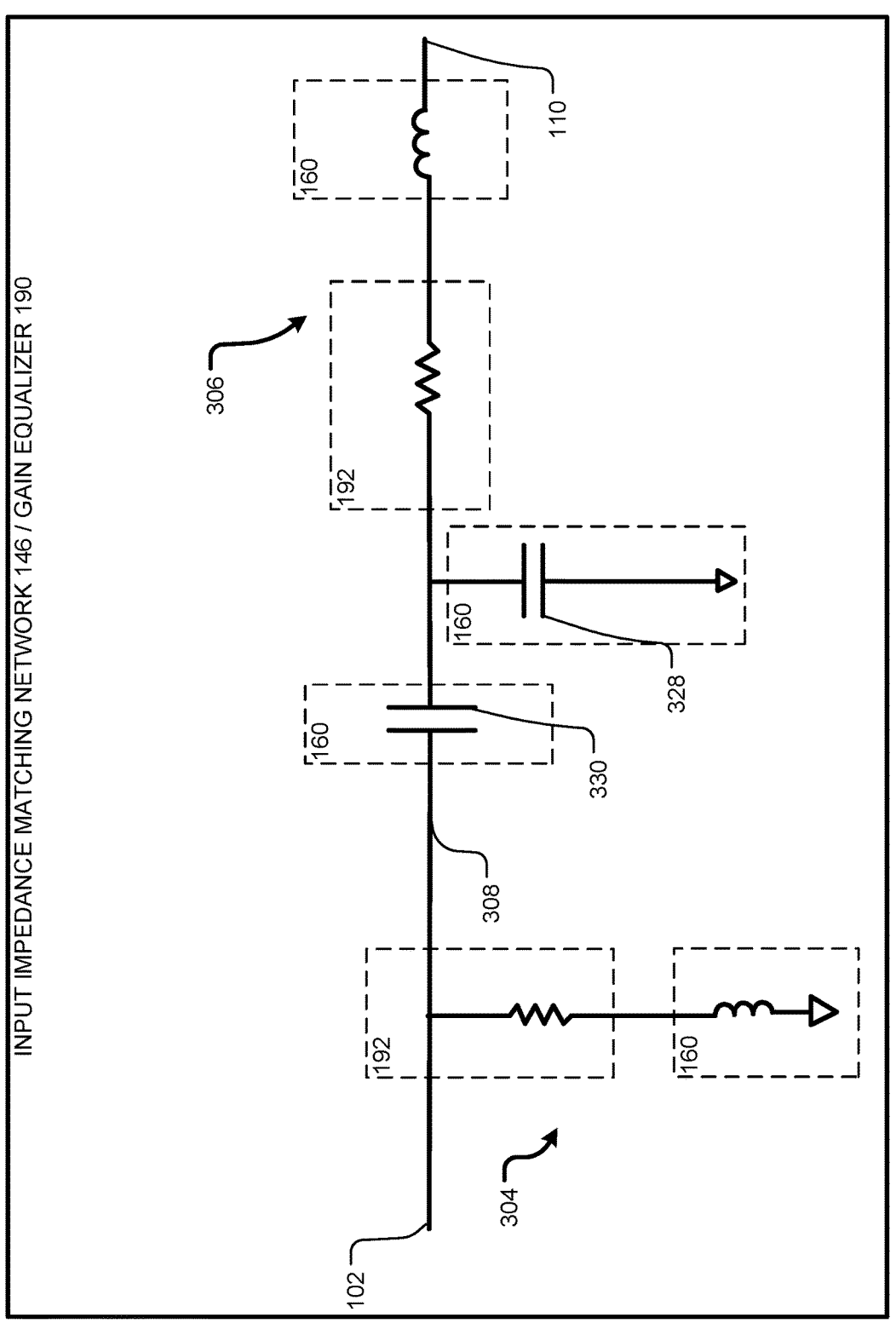
FIG. 6C illustrates an exemplary implementation of an input impedance matching network and a gain equalizer of the RF power amplifier circuit according to FIG. 1.

FIG. 6C illustrates an exemplary implementation of an input impedance matching network and a gain equalizer of the RF power amplifier circuit according to FIG. 1.

In particular, the aspects of FIG. 6C and the description thereof may be implemented in any other aspects and/or figures of the RF power amplifier circuit 100 as described herein. As illustrated in FIG. 6C, the input impedance matching network 146 and the gain equalizer 190 have been implemented with the third equalizer configuration 306 and the second equalizer configuration 304. In aspects, the second equalizer configuration 304 may be arranged upstream from the third equalizer configuration 306. Additionally, in aspects the input impedance matching network 146 and the gain equalizer 190 of FIG. 6C may be implemented with a capacitor 330 on the main RF signal line 308 implemented as part of the one or more impedance matching components 160 and a capacitor 328 connected to the main RF signal line 308 and ground implemented as part of the one or more impedance matching components 160. In aspects, the capacitor 330 and the capacitor 328 may be arranged between the second equalizer configuration 304 and the third equalizer configuration 306.

In this regard, a resistance of the second equalizer configuration 304 and the third equalizer configuration 306 may add losses at lower operating frequencies of the RF power amplifier circuit 100, which reduces gain. On the other hand, a resistance of the second equalizer configuration 304 and the third equalizer configuration 306 may decrease losses at higher operating frequencies of the RF power amplifier circuit 100, which increases gain. Accordingly, the third equalizer configuration 306 and the second equalizer configuration 304 may equalize a gain of the RF power amplifier circuit 100.

Figure 6D:
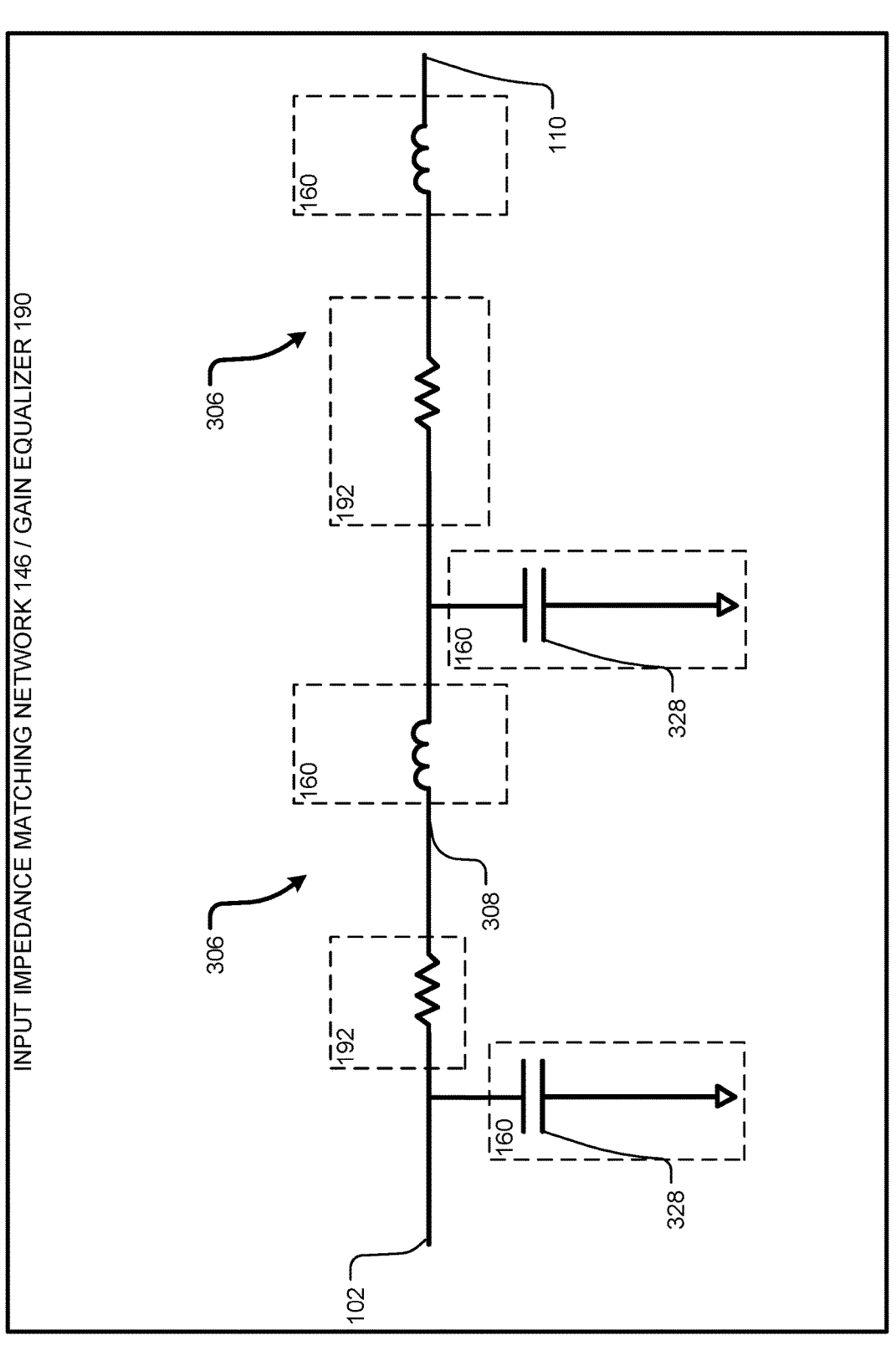
FIG. 6D illustrates an exemplary implementation of an input impedance matching network and a gain equalizer of the RF power amplifier circuit according to FIG. 1.

FIG. 6D illustrates an exemplary implementation of an input impedance matching network and a gain equalizer of the RF power amplifier circuit according to FIG. 1.

In particular, the aspects of FIG. 6D and the description thereof may be implemented in any other aspects and/or figures of the RF power amplifier circuit 100 as described herein. As illustrated in FIG. 6D, the input impedance matching network 146 and the gain equalizer 190 have been implemented with two implementations of the third equalizer configuration 306. Additionally, in aspects the input impedance matching network 146 and the gain equalizer 190 of FIG. 6D may be implemented with a capacitor 328 connected to the main RF signal line 308 and ground and another capacitor 328 connected to the main RF signal line 308 and ground implemented as part of the one or more impedance matching components 160. In aspects, one of the capacitor 328 may be arranged between the two implementations of the third equalizer configuration 306.

In this regard, a resistance of the second equalizer configuration 304 and the third equalizer configuration 306 may add losses at lower operating frequencies of the RF power amplifier circuit 100, which reduces gain. On the other hand, a resistance of the second equalizer configuration 304 and the third equalizer configuration 306 may decrease losses at higher operating frequencies of the RF power amplifier circuit 100, which increases gain. Accordingly, the third equalizer configuration 306 and the second equalizer configuration 304 may equalize a gain of the RF power amplifier circuit 100.

It should be noted that the implementations of the input impedance matching network 146 and the gain equalizer 190 illustrated in FIG. 6A, FIG. 6B, FIG. 6C, and FIG. 6D are merely exemplary. In this regard, the input impedance matching network 146 and the gain equalizer 190 may be implemented in a number of different configurations based on the teachings of the disclosure to equalize a gain, limit a gain slope, flatten a gain, provide a more consistent gain, and/or the like of the RF power amplifier circuit 100 in a given frequency range in implementations of the RF power amplifier circuit 100.

FIG. 7A illustrates a block diagram of an exemplary implementation of a RF power amplifier circuit according to FIG. 1 implemented as a multistage Doherty Power Amplifier Module (PAM).

FIG. 7B illustrates an exemplary implementation of a Massive Multiple-Input and Multiple-Output (MMIMO) simplified front end antenna architecture according to aspects of the disclosure.

In particular, the aspects of FIG. 7A and FIG. 7B and the descriptions thereof may be implemented in any other aspects and/or figures of the RF power amplifier circuit 100 as described herein. FIG. 7A illustrates a block diagram of an exemplary implementation of the RF power amplifier circuit 100 implemented as a multistage Doherty Power Amplifier Module (PAM) 810. As illustrated in FIG. 7A, the multistage Doherty Power Amplifier Module (PAM) 810 is implemented with two stages. However, the disclosure contemplates any number of stages. In aspects, the multistage Doherty Power Amplifier Module (PAM) 810 may be used in a Massive Multiple-Input and Multiple-Output (MMIMO) simplified front end antenna architecture 820 illustrated in FIG. 7B.

As illustrated in FIG. 7A, the multistage Doherty Power Amplifier Module (PAM) 810 may implement a driver stage. In particular, the multistage Doherty Power Amplifier Module (PAM) 810 may include an implementation of the RF amplifier device 108 that may be implemented as a driver stage 188. In particular aspects, the driver stage 188 may be implemented as a GaN driver stage.

Additionally, the multistage Doherty Power Amplifier Module (PAM) 810 may include an implementation of the RF amplifier device 108 that may be implemented as a peak Doherty amplifier device 182. In particular aspects, the peak Doherty amplifier device 182 may be implemented as a peak Doherty GaN amplifier device.

Additionally, the multistage Doherty Power Amplifier Module (PAM) 810 may include an implementation of the RF amplifier device 108 that may be implemented as a main (or carrier) Doherty amplifier device 184. In particular aspects, the main (or carrier) Doherty amplifier device 184 may be implemented as a main Doherty GaN amplifier device. The main (or carrier) Doherty amplifier device 184 may be connected to a negative voltage main; and the peak Doherty amplifier device 182 may be connected to a negative voltage peak.

Additionally, the multistage Doherty Power Amplifier Module (PAM) 810 may include an interstage match/signal splitter 186. An output of the driver stage 188 may be input to the interstage match/signal splitter 186. An output of the interstage match/signal splitter 186 may be input to the main (or carrier) Doherty amplifier device 184 and the peak Doherty amplifier device 182.

Further, the multistage Doherty Power Amplifier Module (PAM) 810 may include a combiner/output match 840. An output from the main (or carrier) Doherty amplifier device 184 and the peak Doherty amplifier device 182 may be input to the combiner/output match 840.

Additionally, the multistage Doherty Power Amplifier Module (PAM) 810 may implement the input impedance matching network 146 and/or the gain equalizer 190 as described herein. In this regard, the input impedance matching network 146 and/or the gain equalizer 190 may see a Doherty amplifier of the multistage Doherty Power Amplifier Module (PAM) 810 as just an amplifier even though the Doherty amplifier of the multistage Doherty Power Amplifier Module (PAM) 810 may be implemented with a plurality transistors, such as the driver stage 188, the main (or carrier) Doherty amplifier device 184, and the peak Doherty amplifier device 182 as illustrated in FIG. 7A.

As illustrated in FIG. 7B, the Massive Multiple-Input and Multiple-Output (MMIMO) simplified front end antenna architecture 820 may be implemented with a signal splitter 822 connected to an array of multiple implementations of the multistage Doherty Power Amplifier Module (PAM) 810. In this regard, there may be 1 to n implementations of the multistage Doherty Power Amplifier Module (PAM) 810. Additionally, the Massive Multiple-Input and Multiple-Output (MMIMO) simplified front end antenna architecture 820 may include antenna elements 824. In aspects, there may be 1 to n implementations of the antenna elements 824 connected to the 1 to n implementations of the multistage Doherty Power Amplifier Module (PAM) 810 forming an antenna array 826. In this regard, each amplifier implementation of the multistage Doherty Power Amplifier Module (PAM) 810 implemented in the Massive Multiple-Input and Multiple-Output (MMIMO) simplified front end antenna architecture 820 of FIG. 7B may be implemented with an implementation of the multistage Doherty Power Amplifier Module (PAM) 810 illustrated in FIG. 7A.

In this regard, aspects of the disclosure implementing the input impedance matching network 146 and/or the gain equalizer 190 may be utilized with a single discrete amplifier, multiple parallel amplifier stages that are combined at the output, a Doherty amplifier where the peak and main RF signal are combined at the output, a single path—multiple stage amplifier, and/or the like.

FIG. 7C illustrates a block diagram of an exemplary implementation of a RF power amplifier circuit according to FIG. 1 implemented as a single path multiple stage amplifier.

In particular, the aspects of FIG. 7C and the description thereof may be implemented in any other aspects and/or figures of the RF power amplifier circuit 100 as described herein. FIG. 7C illustrates a block diagram of an exemplary implementation of the RF power amplifier circuit 100 according to FIG. 1 implemented as a single path multiple stage amplifier 1000.

Referring to FIG. 7C, the single path multiple stage amplifier 1000 is schematically illustrated that includes a pre-amplifier 1010 and an output stage 1030 that are electrically cascaded. As shown in FIG. 7C, the single path multiple stage amplifier 1000 may include the pre-amplifier 1010, an inter-stage impedance matching network 1020, and the output stage 1030. Additionally, the single path multiple stage amplifier 1000 may implement the input impedance matching network 146 and/or the gain equalizer 190 as described herein.

The inter-stage impedance matching network 1020 may include, for example, inductors and/or capacitors arranged in any appropriate configuration in order to form a circuit that improves the impedance match between the output of the pre-amplifier 1010 and the input of the output stage 1030. The RF transistor amplifiers according to embodiments may be used to implement either or both of the pre-amplifier 1010 and the output stage 1030.

FIG. 7D illustrates a block diagram of an exemplary implementation of a RF power amplifier circuit according to FIG. 1 implemented as a multiple path multiple stage amplifier.

In particular, the aspects of FIG. 7D and the description thereof may be implemented in any other aspects and/or figures of the RF power amplifier circuit 100 as described herein. FIG. 7D illustrates a block diagram of an exemplary implementation of the RF power amplifier circuit 100 according to FIG. 1 implemented as a multiple path multiple stage amplifier 1100.

Referring to FIG. 7D, the multiple path multiple stage amplifier 1100 as schematically illustrated includes a pre-amplifier 1010, a pair of inter-stage impedance matching networks 1020-1, 1020-2, and a pair of main amplifiers 1030-1, 1030-2. A splitter 1003 and a combiner 1004 are also provided. The pair of main amplifiers 1030-1, 1030-2 output stage 1030 are arranged electrically in parallel; and the pre-amplifier 1010 output stage 1030 is electrically cascaded with the pair of main amplifiers 1030-1, 1030-2. Additionally, the multiple path multiple stage amplifier 1100 may implement the input impedance matching network 146 and/or the gain equalizer 190 as described herein.

FIG. 7E illustrates a block diagram of an exemplary implementation of a RF power amplifier circuit according to FIG. 1 implemented as a multiple path multiple stage amplifier.

In particular, the aspects of FIG. 7E and the description thereof may be implemented in any other aspects and/or figures of the RF power amplifier circuit 100 as described herein. FIG. 7E illustrates a block diagram of an exemplary implementation of the RF power amplifier circuit 100 according to FIG. 1 implemented as another implementation of the multiple path multiple stage amplifier 1100.

Referring to FIG. 7E, the multiple path multiple stage amplifier 1100 as schematically illustrated includes a pre-amplifier 1010, an impedance matching network 1020, and a pair of main amplifiers 1030-1, 1030-2. A splitter 1003 and a combiner 1004 are also provided. The pair of main amplifiers 1030-1, 1030-2 are arranged electrically in parallel; and the pre-amplifier 1010 is electrically cascaded with the pair of main amplifiers 1030-1, 1030-2. Additionally, the multiple path multiple stage amplifier 1100 may implement a pair of implementations of the input impedance matching network 146 and/or the gain equalizer 190 as described herein.

FIG. 8 illustrates a gain performance of the RF power amplifier implementing the input impedance matching network and the gain equalizer according to the disclosure.

In particular, FIG. 8 illustrates a gain performance 900 that illustrates a gain (dB) along the y-axis and power out (dBm) for the RF power amplifier circuit 100 implementing the input impedance matching network 146 and the gain equalizer 190 of the disclosure along the X axis. Moreover, the gain performance 900 shows the gain (dB) and the power out (dBm) for the RF power amplifier circuit 100 implementing a number of different exemplary frequencies 902.

In this regard, the number of different exemplary frequencies 902 illustrated in the gain performance 900 shown in FIG. 8 have a frequency of 3.3 GHz-4.0 GHz, which is about a 20% relative bandwidth. However, the particular frequencies illustrated in FIG. 8 are merely exemplary data relating to implementation of the RF power amplifier circuit 100 implementing the input impedance matching network 146 and the gain equalizer 190 of the disclosure. In this regard, aspects of the RF power amplifier circuit 100 implementing the input impedance matching network 146 and the gain equalizer 190 of the disclosure are configured to operate with other frequencies as well and may be utilized by the various aspects of the disclosure to equalize a gain, limit a gain slope, flatten a gain, provide a more consistent gain, and/or the like of the RF power amplifier circuit 100 in a given frequency range in implementations of the RF power amplifier circuit 100.

Additionally, the gain performance 900 illustrated in FIG. 8 provides two tables of values of the gain (dB) at a power out (dBm) of 30.345 and a power out (dBm) of 41.704 for the number of different exemplary frequencies 902. As illustrated in FIG. 8, the gain performance 900 shows that the gain (dB) varies from 33.9 dB down to 32.1 dB at a power out (dBm) of 30.345 in the band. Accordingly, the gain performance 900 of the RF power amplifier circuit 100 varies approximately 1.8 dB at a power out (dBm) of 30.345.

Accordingly, the RF power amplifier circuit 100 implementing the input impedance matching network 146 and the gain equalizer 190 of the disclosure reduces a variation of the gain, gain slope, in comparison to standard amplifier implementations, the current RF power amplifier 1, and/or the like. More specifically, in the various implementations of the RF power amplifier circuit 100 implementing aspects of the input impedance matching network 146 and the gain equalizer 190 of the disclosure, a gain slope is reduced at least 1.0 dB, 1.5 dB, 2.0 dB, 2.5 dB, 3.0 dB, 3.5 dB, 4.0 dB, or 4.5 dB in comparison to standard amplifier implementations, the current RF power amplifier 1, and/or the like. Moreover, in the various implementations of the RF power amplifier circuit 100 implementing aspects of the input impedance matching network 146 and the gain equalizer 190 of the disclosure, a gain slope is reduced to a range of 1.0 dB-4.5 dB, 1.0 dB-3.5 dB, 1.5 dB-3.5 dB, 1.5 dB-4.5 dB, 2.0 dB-4.5 dB, 2.5 dB-4.5 dB, 3.0 dB-4.5 dB, or 3.5 dB-4.5 dB in comparison to standard amplifier implementations, the current RF power amplifier 1, and/or the like. Furthermore, in the various implementations of the RF power amplifier circuit 100 implementing aspects of the input impedance matching network 146 and the gain equalizer 190 of the disclosure, a variation of the gain is reduced at least 20%, 30%, 40%, 50%, 60%, 70%, or 80% in comparison to standard amplifier implementations, the current RF power amplifier 1, and/or the like. Additionally, in the various implementations of the RF power amplifier circuit 100 implementing aspects of the input impedance matching network 146 and the gain equalizer 190 of the disclosure, a variation of the gain is reduced at least 20%-30%, 30%-40%, 20%-40%, 40%-50%, 50%-60%, 40%-60%, 60%-70%, or 70%-80% in comparison to standard amplifier implementations, the current RF power amplifier 1, and/or the like.

Implementation of the gain equalizer 190 in the RF power amplifier circuit 100 may be used over all bands covered in cellular infrastructure. Moreover, implementation of the gain equalizer 190 in the RF power amplifier circuit 100 may include allowing coverage over multiple bands. Additionally, the reduction in gain slope obtained by the RF power amplifier circuit 100 implementing the input impedance matching network 146 and the gain equalizer 190 of the disclosure was a surprising result. Additionally, implementation of the input impedance matching network 146 and the gain equalizer 190 in the RF power amplifier circuit 100 provides surprising improvements over standard amplifier implementations, the current RF power amplifier 1, and/or the like. For example, implementation of the input impedance matching network 146 and the gain equalizer 190 in the RF power amplifier circuit 100 provides surprising improvements in reducing gain slope, total gain variation over frequency, over standard amplifier implementations, the current RF power amplifier 1, and/or the like. Moreover, implementation of the input impedance matching network 146 and the gain equalizer 190 in the RF power amplifier circuit 100 provides unexpected improvements in flattening gain over standard amplifier implementations, the current RF power amplifier 1, and/or the like. In this regard, implementation of the input impedance matching network 146 and the gain equalizer 190 in the RF power amplifier circuit 100 provides unexpected improvements in flattening gain over standard amplifier implementations, the current RF power amplifier 1, and/or the like. Moreover, implementation of the input impedance matching network 146 and the gain equalizer 190 in the RF power amplifier circuit 100 provides surprising and unexpected improvements for wideband applications. Additionally, implementation of the input impedance matching network 146 and the gain equalizer 190 in the RF power amplifier circuit 100 provides a surprising and unexpected ability to maintain customer specification requirements.

FIG. 9A illustrates an exemplary implementation of a RF power amplifier circuit according to FIG. 1.

In particular, the aspects of FIG. 9A and the description thereof may be implemented in any other aspects and/or figures of the RF power amplifier circuit 100 as described herein. In particular, FIG. 9A illustrates a packaged implementation 144 of the RF power amplifier circuit 100 including a support 140 and a housing 142.

In aspects, the support 140 may be a laminate, a flange, a metal flange, a metal submount, a support, a surface, a package support, a package surface, a package support surface, a heat sink, a common source support, a common source surface, a common source package support, a common source package surface, a common source package support surface, a common source flange, a common source heat sink, a leadframe, a metal leadframe, a substrate, and/or the like. The support 140 may include an insulating material, a dielectric material, a conductive material, a metallization, and/or the like.

The various components of the RF power amplifier circuit 100 including components of the input impedance matching network 146, components of the gain equalizer 190, the RF amplifier device 108, components of the output impedance matching network 116, and/or the like may be implemented as one or more discrete components, surface mount device (SMD) components, integrated passive device (IPD) components, a Monolithic Microwave Integrated Circuit (MMIC) component, and/or the like. In aspects, one or more of the various components of the RF power amplifier circuit 100 including components of the input impedance matching network 146, components of the gain equalizer 190, the RF amplifier device 108, components of the output impedance matching network 116, and/or the like may be a surface mount device (SMD) component, a surface mount device (SMD) capacitor, a ceramic capacitor, a surface mount device (SMD) ceramic capacitor, an inductor, a surface mount device (SMD) inductor, a resistor, a surface mount device (SMD) resistor, and/or the like. One or more of the various components of the RF power amplifier circuit 100 including components of the input impedance matching network 146, components of the gain equalizer 190, the RF amplifier device 108, components of the output impedance matching network 116, and/or the like may be mounted to the support 140 directly or may be mounted to the support 140 with intervening structures. In aspects, the one or more of the various components of the RF power amplifier circuit 100 including components of the input impedance matching network 146, components of the gain equalizer 190, the RF amplifier device 108, components of the output impedance matching network 116, and/or the like may be mounted to the support 140 by an adhesive, soldering, sintering, eutectic bonding, ultrasonic welding, a clip component, and/or the like as described herein.

Generally speaking, the term IPD refers to an integrated circuit, which may be semiconductor based, and includes a number of passive devices integrally formed within and connected to the terminals of the IC. A custom circuit topology can be provided by an IPD. A variety of different structures are fabricated within the device to provide the necessary frequency response of a specified passive component (e.g., capacitor, inductor, etc.). Examples of these structures include parallel plate capacitors, radial stubs, transmission lines, etc.

Additionally, one or more of the various components of the RF power amplifier circuit 100 including components of the input impedance matching network 146, components of the gain equalizer 190, the RF amplifier device 108, components of the output impedance matching network 116, and/or the like may be connected with one or more interconnects by an adhesive, soldering, sintering, eutectic bonding, ultrasonic welding, a clip component, and/or the like as described herein. The one or more interconnects may be implemented as one or more wires, wire bonds, leads, vias, edge platings, circuit traces, tracks, clips, and/or the like. In one aspect, the one or more interconnects may utilize the same type of connection. In one aspect, the one or more interconnects may utilize different types of connections.

In aspects, the housing 142 of the packaged implementation 144 may include an over-mold configuration. The over-mold configuration may substantially surround the RF amplifier device 108, which may be mounted on the support 140. The over-mold configuration may be formed of a plastic or a plastic polymer compound, which may be injection molded around the support 140, the gain equalizer 190, the output impedance matching network 116, the RF amplifier device 108, the input impedance matching network 146, and/or like thereby providing protection from the outside environment.

The packaged implementation 144 may include electrically conductive input leads or pads that may be located on a first side of the packaged implementation 144, and electrically conductive output leads or pads that may be located on a second side of the packaged implementation 144 in an opposite direction as the electrically conductive input leads or pads. The electrically conductive input leads or pads may provide and/or implement the input port 102 of the amplifier circuit 100 as described herein; and the electrically conductive output leads or pads may provide and/or implement the RF output port 104 of the amplifier circuit 100 as described herein. In one aspect, the packaged implementation 144 may be implemented to include an independent implementation of the DC bias leads or pads be located on sides of the packaged implementation 144 adjacent to the electrically conductive output leads or pads.

The packaged implementation 144 may be implemented with an electrically insulating window frame implementation of the housing 142. The electrically insulating window frame may be formed around a perimeter of the support 140. The electrically insulating window frame may insulate the electrically conductive input leads and the electrically conductive output leads from the support 140. A central portion of the housing 142 may be exposed from the insulating window frame. This exposed portion of the housing 142 may provide an electrically conductive die pad for one or more components of the RF power amplifier circuit 100 thereon.

The packaged implementation 144 may implement the housing 142 to include an open cavity configuration suitable for use with the output impedance matching network 116, the RF amplifier device 108, the input impedance matching network 146, and/or the gain equalizer 190 of the disclosure. In particular, the open cavity configuration may utilize an open cavity package design. In some aspects, the open cavity configuration may include a lid or other enclosure for protecting interconnects, circuit components, the output impedance matching network 116, the RF amplifier device 108, the input impedance matching network 146, the gain equalizer 190, and/or the like. The packaged implementation 144 may include a ceramic body and/or the lid may be made from a ceramic material. In one aspect, the ceramic material may include aluminum oxide ($Al_2O_3$). In one aspect, the lid may be attached to the electrically insulating window frame with an adhesive. In one aspect, the adhesive may be epoxy based.

Inside the packaged implementation 144, the output impedance matching network 116, the RF amplifier device 108, the input impedance matching network 146, and/or the gain equalizer 190 may be attached to the support 140 via a die attach material. The electrically insulating window frame may be configured to isolate a source, a gate, and a drain of the RF amplifier device 108. The electrically insulating window frame may be configured to be more cost effective, provide better coefficient of thermal expansion (CTE) matching with the metal flange, and enable high flexibility in lead configurations for both straight lead and surface mount configurations. The electrically insulating window frame may also be configured to be rigid and therefore more stable and not susceptible to bending.

The packaged implementation 144 may include traces, such as traces etched from copper sheets laminated, embedded, and/or otherwise attached to the support 140. The housing 142 may be attached to an outer peripheral region of the support 140. The support 140 may dissipate the heat generated by the output impedance matching network 116, the RF amplifier device 108, the input impedance matching network 146, and/or the gain equalizer 190.

In various aspects, the RF amplifier device 108 and the RF power amplifier circuit 100 may be a 5G amplifier, a multi-carrier amplifier, a multiband amplifier, an LTE (long term evolution) compliant amplifier, a WCDMA (wideband code division multiple access) compliant amplifier, an 802.11(x) compliant amplifier, and/or the like the RF power amplifier circuit 100 may be utilized in or with a base station, a wireless device, a cellular base station communication transmitter, a cellular base station communication amplifier, a RF power amplifier for various cellular bands, a wireless fidelity (Wi-Fi) device, a multiple-input and multiple-output (MIMO) device, a device utilizing IEEE 802.11n (Wi-Fi), device utilizing IEEE 802.11ac (Wi-Fi), a device implementing Evolved High Speed Packet Access (HSPA+) protocol, a device implementing 3G protocol, a device implementing Worldwide Interoperability for Microwave Access (WiMAX) protocol, a device implementing 4G protocol, a device implementing Long Term Evolution (LTE) protocol, a device implementing 5G protocol, a class-A amplifier device, a class-B amplifier device, a class-C amplifier device, a class-AB amplifier device, a Doherty amplifier, and/or the like, and combinations thereof.

Generally speaking, the RF amplifier device 108 may be any device that can perform amplification of a RF signal. In the depicted aspect, the RF amplifier device 108 is a transistor device, wherein the input terminal 110 corresponds to a control terminal or gate terminal of the transistor device, the output terminal 112 corresponds to a first load terminal, such as a drain terminal, of the transistor device, and the reference potential terminal 114 corresponds to a second load terminal, such as a source terminal, of the transistor device.

The RF amplifier device 108 may be configured to amplify a RF signal across a RF frequency range between the input terminal 110 and the output terminal 112 across a RF frequency range that includes a fundamental RF frequency. According to an aspect, this frequency range may be a "wideband" frequency range. A "wideband" frequency range refers to the fact that the range of frequency values for the RF signal exceeds a coherence bandwidth of a single channel.

In one aspect, the packaged implementation 144 may contain and/or implement two of the RF power amplifier circuit 100 described herein arranged adjacent to one another. In another aspect, the packaged RF amplifier may contain and/or implement one of the RF power amplifier circuit 100.

In particular, the packaged RF amplifier may be implemented at least in part as a Doherty circuit having one of the RF power amplifier circuit 100 implemented as a carrier amplifier and another one of the RF power amplifier circuit 100 implemented as a peaking amplifier. In particular, the packaged RF amplifier may include the carrier amplifier and the peaking amplifier configured such that the packaged RF amplifier power-combines outputs of the carrier amplifier and the peaking amplifier. In one aspect, the two amplifiers may be biased differently. In one aspect, the carrier amplifier may operate at a normal Class AB or Class B. In one aspect, the peaking amplifier may operate at Class C. Other operating classes are contemplated as well.

FIG. 9B illustrates another exemplary implementation of a functional block diagram of a RF power amplifier circuit according to FIG. 1.

In particular, the aspects of FIG. 9B and the description thereof may be implemented in any other aspects and/or figures of the RF power amplifier circuit 100 as described herein. As illustrated in FIG. 9B, the RF power amplifier circuit 100 may further include a DC bias feed network 148. The DC bias feed network 148 may be attached to the input terminal 110 of the RF amplifier device 108.

FIG. 10 is an enlarged partial schematic view of an exemplary implementation of the RF amplifier device according to the disclosure.

FIG. 11 is a schematic cross-sectional view taken along line X-X of FIG. 10.

In particular, the aspects of FIG. 10 and FIG. 11 and the description thereof may be implemented in any other aspects and/or figures of the RF power amplifier circuit 100 as described herein. As shown in FIG. 10, the RF amplifier device 108 and/or the RF amplifier device 108 may include a gate bus 402 that may be connected to a plurality of gate fingers 406 that may extend in parallel in a first direction (e.g., the x-direction indicated in FIG. 10). A source bus 410 may be connected to a plurality of parallel ones of the source contacts 416. The source bus 410 may be connected to a ground voltage node on the underside of the RF amplifier device 108 and/or the RF amplifier device 108. A drain bus 420 may be connected to a plurality of drain contacts 426.

As can be seen in FIG. 10, each gate finger 406 may run along the X-direction between a pair of adjacent ones of the source contact 416 and drain contact 426. The RF amplifier device 108 or the RF amplifier device 108 may include a plurality of unit cells 430, where each one of the plurality of unit cells 430 may include an individual transistor. One of the plurality of unit cells 430 is illustrated by the dashed Box in FIG. 10, and includes a gate finger 406 that may extend between adjacent ones of the source contact 416 and the drain contact 426. The a "gate width" may refer to the distance by which the gate finger 406 overlaps with its associated one of the source contact 416 and drain contact 426 in the X-direction. That is, "width" of a gate finger 406 refers to the dimension of the gate finger 406 that extends in parallel to the adjacent source contact 416/drain contact 426 (the distance along the z-direction). Each of the plurality of unit cells 430 may share one of the source contact 416 and/or a drain contact 426 with one or more adjacent ones of the plurality of unit cells 430. Although a particular number of the of the plurality of unit cells 430 is illustrated in FIG. 10, it will be appreciated that the RF amplifier device 108 and/or the RF amplifier device 108 may include more or less of the plurality of unit cells 430.

Referring to FIG. 11, the RF amplifier device 108 and/or the RF amplifier device 108 may include a semiconductor structure 440 that includes a substrate 422, which may, for example, include 4H—SiC or 6H—SiC. A channel layer 490 may be arranged on the substrate 422, and a barrier layer 470 may be arranged on the channel layer 490 so that the channel layer 490 is between the substrate 422 and the barrier layer 470. The channel layer 490 and the barrier layer 470 may include Group III-nitride based materials, with the material of the barrier layer 470 having a higher bandgap than the material of the channel layer 490. For example, the channel layer 490 may include GaN, while the barrier layer 470 may comprise AlGaN.

Due to the difference in bandgap between the barrier layer 470 and the channel layer 490 and piezoelectric effects at the interface between the barrier layer 470 and the channel layer 490, a two-dimensional electron gas (2DEG) is induced in the channel layer 490 at a junction between the channel layer 490 and the barrier layer 470. The 2DEG acts as a highly conductive layer that allows conduction between the source and drain regions of the device that may be beneath a source contact 416 and a drain contact 426, respectively. The source contact 416 and the drain contact 426 may be on the barrier layer 470. Gate fingers 406 may be on the barrier layer 470 between the source contacts 416 and the drain contacts 426. While the gate fingers 406 and the source contact 416 and the drain contacts 426 are all shown as having the same "length" in FIG. 10, it will be appreciated that in practice the gate fingers 406 may have lengths that are substantially smaller than the lengths of the source contacts 416 and the drain contacts 426, and it will also be appreciated that the source contacts 416 and the drain contacts 426 need not have the same lengths.

The material of the gate finger 406 may be chosen based on the composition of the barrier layer 470. However, in certain embodiments, materials capable of making a Schottky contact to a nitride based semiconductor material may be used, such as Ni, Pt, NiSi$_x$, Cu, Pd, Cr, W and/or WSiN. The source contacts 416 and drain contacts 426 may include a metal, such as TiAlN, that can form an ohmic contact to GaN.

The RF amplifier device 108 and/or the RF amplifier device 108 may include a metallization layer located on a lower surface of the substrate 422. The metallization layer may be located in a plane generally parallel to the z-axis and/or the x-axis. In one aspect, the metallization layer may be implemented as a full face metallic layer on the lower surface of the substrate 422. The RF amplifier device 108 and/or the RF amplifier device 108 may include separate conducting lines, tracks, circuit traces, pads for connections, vias to pass connections between layers of aluminum, copper, silver, gold, and/or the like, and features such as solid conductive areas for EM shielding or other purposes.

In aspects, the RF amplifier device 108 may be implemented as a Field-Effect Transistor (FET), a Metal-Oxide-Semiconductor Field-Effect Transistor (MOSFET), a Laterally Diffused MOSFET (LDMOS), a transistor implemented as an amplifier, a GaN High-Electron-Mobility Transistor (HEMT), an HBT (heterojunction bipolar transistor), CMOS (complementary metal-oxide semiconductor) devices, devices having material such as GaAs (Gallium arsenide), Si (silicon), SiGe (silicon-germanium), GaN, and/or the like, a GaN metal-semiconductor field-effect transistor (MESFET) transistor, a bipolar transistor, a discrete device, a Doherty arrangement, any device utilizing a bias feed, and the like. Further, more than one the RF amplifier device 108 can be mounted in the RF power amplifier circuit 100 and connected in parallel. In this regard, a plurality of implementations of the RF amplifier device 108 may utilize the same type of transistors; and/or a plurality of implementations of the RF amplifier device 108 may utilize different types of transistors. In one aspect, the gain equalizer 190 of the disclosure may be utilized by the various aspects of the disclosure to equalize a gain, limit a gain slope, flatten a gain, provide a more consistent gain, and/or the like of in other types of device technology.

In one aspect, the RF amplifier device 108 may be implemented as a high-power transistor. In one aspect, the RF amplifier device 108 may be implemented as a high-power Laterally Diffused MOSFET (LDMOS), a high-power GaN High-Electron-Mobility Transistor (HEMT), an HBT (heterojunction bipolar transistor), CMOS (complementary metal-oxide semiconductor) devices, devices having material such as GaAs (Gallium arsenide), Si (silicon), SiGe (silicon-germanium), GaN, and/or the like, and/or a high-power GaN metal-semiconductor field-effect transistor (MESFET) transistor. In one aspect, the gain equalizer 190 of the disclosure may be utilized by the various aspects of the disclosure to equalize a gain, limit a gain slope, flatten a gain, provide a more consistent gain, and/or the like of in other types of device technology.

In one aspect, the RF amplifier device 108 may be implemented as a high-frequency transistor. In one aspect, the RF amplifier device 108 may be implemented as a high-frequency Laterally Diffused MOSFET (LDMOS), a high-frequency GaN High-Electron-Mobility Transistor (HEMT), an HBT (heterojunction bipolar transistor), CMOS (complementary metal-oxide semiconductor) devices, devices having material such as GaAs (Gallium arsenide), Si (silicon), SiGe (silicon-germanium), GaN, and/or the like, and/or a high-frequency GaN metal-semiconductor field-effect transistor (MESFET) transistor. In one aspect, the gain equalizer 190 of the disclosure may be utilized by the various aspects of the disclosure to equalize a gain, limit a gain slope, flatten a gain, provide a more consistent gain, and/or the like of in other types of device technology.

In aspects, the output impedance matching network 116 may be implemented with various circuit combinations of one or more capacitors, one or more inductors, and/or the like. In particular aspects, the output impedance matching network 116 may include inductive and capacitive elements that are used to provide impedance matching for the output of the RF amplifier device 108.

FIG. 12 illustrates a process of implementing a package according to the disclosure.

The process illustrated in FIG. 12 and described below may include any one or more other features, components, arrangements, and/or the like as described herein. In particular, FIG. 12 illustrates a process of forming a package 700 that relates to the packaged implementation 144 as described herein. It should be noted that the aspects of the process of forming a package 700 may be performed in a different order consistent with the aspects described herein. Additionally, it should be noted that portions of the process of forming a package 700 may be performed in a different order consistent with the aspects described herein. Moreover, the process of forming a package 700 may be modified to have more or fewer processes consistent with the various aspects disclosed herein.

Initially, the process of forming a package 700 may include a process of forming the support 702. More specifically, the support 140 may be constructed, configured, and/or arranged as described herein. In aspects, the support 140 may be a laminate, a flange, a metal flange, a metal submount, a support, a surface, a package support, a package surface, a package support surface, a heat sink, a common source support, a common source surface, a common source package support, a common source package surface, a common source package support surface, a common source flange, a common source heat sink, a leadframe, a metal leadframe, a substrate, and/or the like. The support 140 may include an insulating material, a dielectric material, a conductive material, a metallization, and/or the like.

The process of forming a package 700 may include a process of forming the one or more interconnects 704. More specifically, the one or more interconnects may be constructed, configured, and/or arranged as described herein. In one aspect, the process of forming the one or more interconnects 704 may include forming the one or more interconnects by forming one or more wires, leads, vias, edge platings, circuit traces, tracks, and/or the like on the support 140 and/or between and to the components of the RF power amplifier circuit 100 including the output impedance matching network 116, the RF amplifier device 108, the input impedance matching network 146, and/or the gain equalizer 190.

The process of forming a package 700 may include a process of arranging components on the support 706. More specifically, the process of arranging components on the support 706 may include arranging components of the RF power amplifier circuit 100 including the output impedance matching network 116, the RF amplifier device 108, the input impedance matching network 146, and/or the gain equalizer 190 on the support 140 as described herein. Thereafter, the process of arranging components on the support 706 may further include attaching the components of the RF power amplifier circuit 100 including the output impedance matching network 116, the RF amplifier device 108, the input impedance matching network 146, and/or the gain equalizer 190 to the support 140. In this regard, the components of the RF power amplifier circuit 100 may be mounted on the upper surface of the support 140 by an adhesive, soldering, sintering, eutectic bonding, ultrasonically welding, and/or the like as described herein.

The process of forming a package 700 may include a process of enclosing the package 708. More specifically, the packaged implementation 144 may be constructed, configured, and/or arranged as described herein. In aspects, the housing 142 of the packaged implementation 144 may include an over-mold configuration, an electrically insulating window frame implementation of the housing 142, the housing 142 may include an open cavity configuration, and/or the like.

As described herein, the disclosure has set forth an implementation of the RF power amplifier circuit 100 and/or the packaged RF amplifier that includes a gain equalizer. As disclosed herein, the gain equalizer may be configured for reducing component count, cost and complexity.

The following are a number of nonlimiting EXAMPLES of aspects of the disclosure. One EXAMPLE includes: EXAMPLE 1. An amplifier includes: an input impedance matching network; at least one transistor; an input lead coupled to the at least one transistor; an output lead coupled to the at least one transistor; and a gain equalizer configured to equalize gain, where the gain equalizer is connected to components of the input impedance matching network.

The above-noted EXAMPLE may further include any one or a combination of more than one of the following EXAMPLES: 2. The amplifier according to any EXAMPLE herein where: the gain equalizer and the input impedance matching network are configured as an equalizing input matching circuit; and the equalizing input matching circuit includes equalizing components of the gain equalizer to equalize the gain and the input impedance matching network being configured to maintain an input impedance. 3. The amplifier according to any EXAMPLE herein where one or more equalizer components of the gain equalizer are connected to one or more impedance matching components of the input impedance matching network. 4. The amplifier according to any EXAMPLE herein where one or more equalizer components of the gain equalizer are connected in parallel to one or more impedance matching components of the input impedance matching network. 5. The amplifier according to any EXAMPLE herein where one or more equalizer components of the gain equalizer are cascaded to one or more impedance matching components of the input impedance matching network. 6. The amplifier according to any EXAMPLE herein where: one or more equalizer components of the gain equalizer are cascaded to one or more impedance matching components of the input impedance matching network; and one or more equalizer components of the gain equalizer are cascaded to one or more impedance matching components of the input impedance matching network. 7. The amplifier according to any EXAMPLE herein includes a housing, where the gain equalizer and the input impedance matching network are arranged in the housing. 8. The amplifier according to any EXAMPLE herein includes a support, where the gain equalizer and the input impedance matching network are arranged on the support. 9. The amplifier according to any EXAMPLE herein where the at least one transistor includes a GaN based transistor. 10. The amplifier according to any EXAMPLE herein where the at least one transistor includes a LDMOS based transistor. 11. The amplifier according to any EXAMPLE herein where: the at least one transistor includes a transistor implemented as a carrier amplifier; and the at least one transistor includes a transistor implemented as a peaking amplifier.

One EXAMPLE includes: EXAMPLE 12. A process of implementing an amplifier includes: providing an input impedance matching network; providing at least one transistor; providing a gain equalizer configured to equalize gain; coupling an input lead to the at least one transistor; coupling an output lead to the at least one transistor; and coupling the gain equalizer to components of the input impedance matching network.

The above-noted EXAMPLE may further include any one or a combination of more than one of the following EXAMPLES: 13. The process of implementing an amplifier according to any EXAMPLE herein includes configuring the gain equalizer and the input impedance matching network as an equalizing input matching circuit, where the equalizing input matching circuit includes equalizing components of the gain equalizer to equalize the gain and the input impedance matching network being configured to maintain an input impedance. 14. The process of implementing an amplifier according to any EXAMPLE herein includes connecting one or more equalizer components of the gain equalizer to one or more impedance matching components of the input impedance matching network. 15. The process of implementing an amplifier according to any EXAMPLE herein includes connecting one or more equalizer components of the gain equalizer a in parallel to one or more impedance matching components of the input impedance matching network. 16. The process of implementing an amplifier according to any EXAMPLE herein includes connecting one or more equalizer components of the gain equalizer in series and/or parallel to one or more impedance matching components of the input impedance matching network. 17. The process of implementing an amplifier according to any EXAMPLE herein includes: connecting one or more equalizer components of the gain equalizer in series and/or parallel to one or more impedance matching components of the input impedance matching network; and connecting one or more equalizer components of the gain equalizer in series and/or parallel to one or more impedance matching components of the input impedance matching network. 18. The process of implementing an amplifier according to any EXAMPLE herein includes: providing a housing; and arranging the gain equalizer and the input impedance matching network in the housing. 19. The process of implementing an amplifier according to any EXAMPLE herein includes: providing a support; and arranging the gain equalizer and the input impedance matching network on the support. 20. The process of implementing an amplifier according to any EXAMPLE herein where the at least one transistor includes a GaN based transistor. 21. The process of implementing an amplifier according to any EXAMPLE herein where the at least one transistor includes a LDMOS based transistor. 22. The process of implementing an amplifier according to any EXAMPLE herein where: the at least one transistor includes a transistor implemented as a carrier amplifier; and the at least one transistor includes a transistor implemented as a peaking amplifier.

In particular, connected as described herein may include coupling or connections that may include leads, wire bonding, an adhesive, soldering, sintering, eutectic bonding, thermal compression bonding, ultrasonic bonding/welding, a clip component, and/or the like as described herein. The connection may be through intervening structures or components or the connection may be a direct connection.

The adhesive of the disclosure may be utilized in an adhesive bonding process that may include applying an intermediate layer to connect surfaces to be connected. The adhesive may be organic or inorganic; and the adhesive may be deposited on one or both surfaces of the surface to be connected. The adhesive may be utilized in an adhesive bonding process that may include applying adhesive material with a particular coating thickness, at a particular bonding temperature, for a particular processing time while in an environment that may include applying a particular tool pressure. In one aspect, the adhesive may be a conductive adhesive, an epoxy-based adhesive, a conductive epoxy-based adhesive, and/or the like.

The solder of the disclosure may be utilized to form a solder interface that may include solder and/or be formed from solder. The solder may be any fusible metal alloy that may be used to form a bond between surfaces to be connected. The solder may be a lead-free solder, a lead solder, a eutectic solder, or the like. The lead-free solder may contain tin, copper, silver, bismuth, indium, zinc, antimony, traces of other metals, and/or the like. The lead solder may contain lead, other metals such as tin, silver, and/or the like. The solder may further include flux as needed.

The sintering of the disclosure may utilize a process of compacting and forming a solid mass of material by heat and/or pressure. The sintering process may operate without melting the material to the point of liquefaction. The sintering process may include sintering of metallic powders. The sintering process may include sintering in a vacuum. The sintering process may include sintering with the use of a protective gas.

The eutectic bonding of the disclosure may utilize a bonding process with an intermediate metal layer that may form a eutectic system. The eutectic system may be used between surfaces to be connected. The eutectic bonding may utilize eutectic metals that may be alloys that transform from solid to liquid state, or from liquid to solid state, at a specific composition and temperature without passing a two-phase equilibrium. The eutectic alloys may be deposited by sputtering, dual source evaporation, electroplating, and/or the like.

The ultrasonically welding of the disclosure may utilize a process whereby high-frequency ultrasonic acoustic vibrations are locally applied to components being held together under pressure. The ultrasonically welding may create a solid-state weld between surfaces to be connected. In one aspect, the ultrasonically welding may include applying a sonicated force.

In particular aspects, the RF power amplifier circuit 100 and/or the RF amplifier of the disclosure may be utilized in wireless base stations that connect to a wireless device. In further aspects, the RF power amplifier circuit 100 and/or the RF amplifier of the disclosure may be utilized in amplifiers implemented by wireless base stations that connect to a wireless device. In further aspects, the RF power amplifier circuit 100 and/or the RF amplifier of the disclosure may be utilized in wireless devices. In further aspects, the RF power amplifier circuit 100 and/or the RF amplifier of the disclosure may be utilized in amplifiers implemented in wireless devices.

In this disclosure it is to be understood that reference to a wireless device is intended to encompass electronic devices such as mobile phones, tablet computers, gaming systems, MP3 players, personal computers, PDAs, user equipment (UE), and the like. A "wireless device" is intended to encompass any compatible mobile technology computing device that can connect to a wireless communication network, such as mobile phones, mobile equipment, mobile stations, user equipment, cellular phones, smartphones, handsets, wireless dongles, remote alert devices, Internet of things (IoT) based wireless devices, or other mobile computing devices that may be supported by a wireless network. The wireless device may utilize wireless communication technologies like GSM, CDMA, wireless local loop, Wi-Fi, WiMAX, other wide area network (WAN) technology, 3G technology, 4G technology, 5G technology, LTE technology, and/or the like.

In this disclosure it is to be understood that reference to a wireless base station is intended to cover base transceiver station (BTS), node B devices, Base Station (BS) devices, evolved node B devices, and the like that facilitate wireless communication between wireless devices and a network. The wireless base station and/or the network may utilize wireless communication technologies like GSM, CDMA, wireless local loop, Wi-Fi, WiMAX, other wide area network (WAN) technology, 3G technology, 4G technology, 5G technology, LTE technology, and the like. However, aspects of the disclosure are applicable to other implementations as well.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An amplifier comprising:
an input impedance matching network comprising at least one impedance matching component;
at least one transistor;
an input lead coupled to the at least one transistor;
an output lead coupled to the at least one transistor; and
a gain equalizer configured to equalize gain and the gain equalizer comprising at least one equalizer component,
wherein the at least one equalizer component of the gain equalizer is connected in series or parallel with the at least one impedance matching component of the input impedance matching network.

2. The amplifier according to claim 1 wherein:
the gain equalizer and the input impedance matching network are configured as an equalizing input matching circuit; and
the equalizing input matching circuit comprises the at least one equalizer component of the gain equalizer to equalize the gain and the input impedance matching network being configured to maintain an input impedance.

3. The amplifier according to claim 1 wherein the at least one equalizer component of the gain equalizer is connected in series and/or parallel to the at least one impedance matching component of the input impedance matching network; and wherein the at least one impedance matching component comprises an inductor and/or a capacitor.

4. The amplifier according to claim 1 wherein the at least one equalizer component of the gain equalizer is connected in parallel to the at least one impedance matching component of the input impedance matching network; and wherein the at least one impedance matching component comprises an inductor and/or a capacitor.

5. The amplifier according to claim 1 wherein one or more equalizer components of the gain equalizer are cascaded to one or more impedance matching components of the input impedance matching network.

6. The amplifier according to claim 1 wherein:
   one or more equalizer components of the gain equalizer are cascaded to one or more impedance matching components of the input impedance matching network; and
   one or more equalizer components of the gain equalizer are cascaded to one or more impedance matching components of the input impedance matching network.

7. The amplifier according to claim 6 wherein the one or more equalizer components of the gain equalizer comprise at least one resistor in series and/or parallel with the at least one impedance matching component.

8. The amplifier according to claim 7 wherein the at least one resistor has a resistance of 0.1 ohm-5 ohm.

9. The amplifier according to claim 1 wherein the gain equalizer is configured to reduce a variation of gain to a range of 1.0 dB-4.0 dB.

10. The amplifier according to claim 1 wherein the gain equalizer is configured to reduce a variation of gain at least 20%.

11. The amplifier according to claim 1 further comprising a housing,
   wherein the gain equalizer and the input impedance matching network are arranged in the housing.

12. The amplifier according to claim 1 further comprising a support,
   wherein the gain equalizer and the input impedance matching network are arranged on the support.

13. The amplifier according to claim 1 wherein the at least one transistor comprises a GaN based transistor.

14. The amplifier according to claim 1 wherein the at least one transistor comprises a LDMOS based transistor.

15. The amplifier according to claim 1 wherein:
   the at least one transistor comprises a transistor implemented as a carrier amplifier; and
   the at least one transistor comprises a transistor implemented as a peaking amplifier.

16. The amplifier according to claim 1 wherein the at least one transistor comprises a plurality transistors configured in a Doherty configuration.

17. The amplifier according to claim 1 wherein the at least one transistor comprises a plurality of transistors configured in a multistage configuration.

18. A process of implementing an amplifier comprising:
   providing an input impedance matching network comprising at least one impedance matching component;
   providing at least one transistor;

providing a gain equalizer configured to equalize gain and the gain equalizer comprising at least one equalizer component;
   coupling an input lead to the at least one transistor;
   coupling an output lead to the at least one transistor; and
   coupling the at least one equalizer component of the gain equalizer in series or parallel with the at least one impedance matching component of the input impedance matching network.

19. The process of implementing an amplifier according to claim 18 further comprising configuring the gain equalizer and the input impedance matching network as an equalizing input matching circuit,
   wherein the equalizing input matching circuit comprises the at least one equalizer component of the gain equalizer to equalize the gain and the input impedance matching network being configured to maintain an input impedance.

20. The process of implementing an amplifier according to claim 18 further comprising connecting the at least one equalizer component of the gain equalizer in series and/or parallel with the at least one impedance matching component of the input impedance matching network.

21. The process of implementing an amplifier according to claim 20 further comprising connecting the at least one equalizer component of the gain equalizer in series and/or parallel to the at least one impedance matching component of the input impedance matching network, wherein the at least one impedance matching component comprises an inductor and/or a capacitor.

22. The process of implementing an amplifier according to claim 20 wherein the gain equalizer is configured to reduce a variation of gain to a range of 1.0 dB-4.0 dB.

23. The process of implementing an amplifier according to claim 20 wherein the gain equalizer is configured to reduce a variation of gain at least 20%.

24. The process of implementing an amplifier according to claim 18 further comprising connecting the at least one equalizer component of the gain equalizer in parallel to the at least one impedance matching component of the input impedance matching network, wherein the at least one impedance matching component comprises an inductor and/or a capacitor.

25. The process of implementing an amplifier according to claim 18 further comprising:
   connecting the at least one equalizer component of the gain equalizer in series and/or parallel to one or more impedance matching components of the input impedance matching network, wherein the at least one impedance matching component comprises an inductor and/or a capacitor.

26. The process of implementing an amplifier according to claim 25 wherein the at least one equalizer component of the gain equalizer comprise at least one resistor.

27. The process of implementing an amplifier according to claim 26 wherein the at least one resistor has a resistance of 0.1 ohm-5 ohm.

28. The process of implementing an amplifier according to claim 18 further comprising:
   providing a housing; and
   arranging the gain equalizer and the input impedance matching network in the housing.

29. The process of implementing an amplifier according to claim 18 further comprising:
   providing a support; and
   arranging the gain equalizer and the input impedance matching network on the support.

30. The process of implementing an amplifier according to claim 18 wherein the at least one transistor comprises a GaN based transistor.

31. The process of implementing an amplifier according to claim 18 wherein the at least one transistor comprises a LDMOS based transistor.

32. The process of implementing an amplifier according to claim 18 wherein:

the at least one transistor comprises a transistor implemented as a carrier amplifier; and the at least one transistor comprises a transistor implemented as a peaking amplifier.

* * * * *